(12) United States Patent  (10) Patent No.: US 8,344,427 B2
Omura  (45) Date of Patent: Jan. 1, 2013

(54) STANDARD CELL, SEMICONDUCTOR DEVICE HAVING STANDARD CELLS, AND METHOD FOR LAYING OUT AND WIRING THE STANDARD CELL

(75) Inventor: Hiroshi Omura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/563,205

(22) Filed: Jul. 31, 2012

(65) Prior Publication Data

US 2012/0292714 A1  Nov. 22, 2012

Related U.S. Application Data

(63) Continuation of application No. 13/101,778, filed on May 5, 2011, now Pat. No. 8,258,553.

(30) Foreign Application Priority Data

May 7, 2010 (JP) .................... 2010-107409

(51) Int. Cl.
*H01L 27/118* (2006.01)
(52) U.S. Cl. .................... 257/206; 257/204; 257/565
(58) Field of Classification Search .................. 257/204, 257/206, 565
See application file for complete search history.

(56) References Cited

U.S. PATENT DOCUMENTS

| 6,785,877 B1 | 8/2004 | Kozai |
| 7,501,689 B2 | 3/2009 | Yoshida et al. |
| 2002/0043667 A1* | 4/2002 | Shibata et al. ............... 257/202 |
| 2007/0300202 A1 | 12/2007 | Uchida |
| 2011/0177658 A1 | 7/2011 | Law et al. |

FOREIGN PATENT DOCUMENTS

| JP | 7-249747 | 9/1995 |
| JP | 8-222640 | 8/1996 |
| JP | 2001-015602 | 1/2001 |
| JP | 2001-189427 | 7/2001 |
| JP | 2005-236107 | 9/2005 |
| JP | 2008-004790 | 1/2008 |
| JP | 2009-158728 | 7/2009 |

* cited by examiner

*Primary Examiner* — Bradley K Smith
(74) *Attorney, Agent, or Firm* — McDermott Will & Emery LLP

(57) ABSTRACT

The chip area of a semiconductor device having a plurality of standard cells is to be made smaller. A semiconductor device includes first and second standard cells. The first standard cell includes a diffusion region, a functional device region opposed to the diffusion region, and a metal layer. The second standard cell includes another diffusion region continuous with the diffusion region, another functional device region opposed to the other diffusion region, and further another diffusion region formed between the other diffusion region and the other functional device region. The metal layer and the other functional device region are coupled together electrically through the diffusion regions.

3 Claims, 13 Drawing Sheets

STANDARD CELL, SEMICONDUCTOR DEVICE HAVING STANDARD CELLS, AND METHOD FOR LAYING OUT AND WIRING THE STANDARD CELL

CROSS-REFERENCE TO RELATED APPLICATIONS

This application is a Continuation of U.S. application Ser. No. 13/101,778, filed on May 5, 2011 now U.S. Pat. No. 8,258,553, claiming priority of Japanese Patent Application No. 2010-107409, filed on May 7, 2010, the entire contents of each of which are hereby incorporated by reference.

BACKGROUND

The present invention relates to a standard cell, a semiconductor device having standard cells, and a method for laying out and wiring the standard cell.

Such a semiconductor device as SOC (System On Chip) is designed using standard cells. The following Patent Documents 1 to 7 each disclose a technique for reducing the area of a chip in a semiconductor device which is designed using standard cells.

Japanese Unexamined Patent Publication No. 2001-15602 (Patent Document 1) discloses a standard cell including a VDD terminal formed by a p-type diffusion layer, a VSS terminal formed by an n-type diffusion layer, and input and output terminals formed by a metal layer, the diffusion layers and the metal layer being coupled together through contact holes.

Japanese Unexamined Patent Publication No. 2001-189427 (Patent Document 2) discloses a standard cell wherein a GND wire is disposed in a first metal layer and a VDD trunk is disposed in a second metal layer.

Japanese Unexamined Patent Publication No. 2005-236107 (Patent Document 3) discloses a standard cell including a basic power supply metal layer disposed above a circuit, a transistor element layer formed on a circuit board under the basic power supply metal layer, and an internal wiring layer for supplying a supply voltage from the basic power supply metal layer to the transistor element layer.

Japanese Unexamined Patent Publication No. Hei 8 (1996)-222640 (Patent Document 4) discloses a standard cell including an n-type high density region provided on an upper side of an n-type substrate and coupled to a conductor for power supply and a p-type high density region provided on a lower side of a p-type well and coupled to a conductor for grounding, the n- and p-type high density regions being continuous with each other between the standard cell and a standard cell adjacent thereto in a cell row direction.

Japanese Unexamined Patent Publication No. 2008-4790 (Patent Document 5) discloses a standard cell including an active region provided between a VDD trunk and a GND trunk, a plurality of transistors formed in the active region, and coupling portions extended from the active region up to below the VDD trunk and the GND trunk, the coupling portions being coupled to the VDD trunk and the GND trunk respectively.

Japanese Unexamined Patent Publication No. Hei 7 (1995)-249747 (Patent Document 6) discloses a standard cell wherein an n-type channel transistor and a p-type channel transistor are arranged in the channel width direction between a drain electrode region and an earth electrode region.

Japanese Unexamined Patent Publication No. 2009-158728 (Patent Document 7) discloses a standard cell including a semiconductor substrate, a contact region formed on the surface of the semiconductor substrate, an interlayer dielectric film formed on the semiconductor substrate, an open trench formed within the interlayer dielectric film and extended linearly up to the contact region, and a conductive layer buried within the open trench and coupled electrically to the contact region.

SUMMARY

It is an object of the present invention to provide a standard cell, a semiconductor device having standard cells, and a method for laying out and wiring the standard cell, capable of making the area of a chip smaller.

The semiconductor device according to the present invention includes first and second standard cells formed over a surface of a semiconductor substrate.

The first standard cell includes a band-like first impurity diffusion region formed over the surface of the semiconductor substrate, a first functional device region formed over the surface of the semiconductor substrate and opposed to the first impurity diffusion region, and a first metal layer disposed above the surface of the semiconductor substrate, the first metal layer including a first trunk portion extending above and along the first impurity diffusion region and a first extending portion extending upwards of the first functional device region from the first trunk portion.

The second standard cell includes a band-like second impurity diffusion region formed over the surface of the semiconductor substrate and continuous with the first impurity diffusion region, a second functional device region formed over the surface of the semiconductor substrate and opposed to the second impurity diffusion region, and an impurity diffusion region for coupling, the impurity diffusion region for coupling formed between the second impurity diffusion region and the second functional device region over the surface of the semiconductor substrate to couple the second impurity diffusion region and the second functional device region electrically with each other.

The first metal layer and the second functional device region are coupled together electrically through the first trunk portion, the first impurity diffusion region, the second impurity diffusion region and further through the impurity diffusion region for coupling.

The standard cell according to the present invention includes first and second standard cells formed over a surface of a semiconductor substrate.

The first standard cell includes a first functional device region formed over the surface of the semiconductor substrate, band-like first impurity diffusion regions formed over the surface of the semiconductor substrate and disposed in opposition to each other with both sides of the first functional device region therebetween, and metal layers disposed above the surface of the semiconductor substrate, the metal layers each including a trunk portion and an extending portion, the trunk portions of the metal layers extending above and along the first impurity diffusion regions respectively, the extending portions of the metal layers extending upwards of the first functional device region.

The second standard cell includes a second functional device region formed over the surface of the semiconductor device, band-like second impurity diffusion regions formed over the surface of the semiconductor substrate and disposed in opposition to each other with both sides of the second functional device region therebetween, the second impurity diffusion regions being continuous with the first impurity diffusion regions respectively, and impurity diffusion regions for coupling formed over the surface of the semiconductor substrate to couple respectively between the second impurity diffusion regions and the second functional device region.

The metal layers and the second functional device region are coupled together electrically with each other through the trunk portions, the first impurity diffusion regions, the second impurity diffusion regions and the impurity diffusion regions for coupling.

The method for laying out and wiring the standard cell according to the present invention is a method for laying out and wiring the standard cells used in the semiconductor device described above or the standard cell described above and includes the steps of providing a cell library with pattern information on the second standard cell stored therein, inputting predetermined circuit coupling information into a layout and wiring system, and allowing the layout and wiring system to read out the pattern information on predetermined standard cells other than the second standard cell from the cell library and to lay out the pattern information on the standard cells so as to correspond to the circuit coupling information.

Further, the method for laying out and wiring the standard cell according to the present invention includes the steps of detecting the occurrence of a wiring crowded area in which the density of wiring lines coupling between the standard cells exceeds a predetermined value, and allowing the layout and wiring system to readout the pattern information on the second standard cell from the cell library and to replace the standard cells included in the wiring crowded area by the second standard cell.

According to the present invention it is possible to provide a standard cell, a semiconductor device having standard cells, and a method for laying out and wiring the standard cell(s), capable of making the area of a chip smaller.

DETAILED DESCRIPTION

Figure 1:
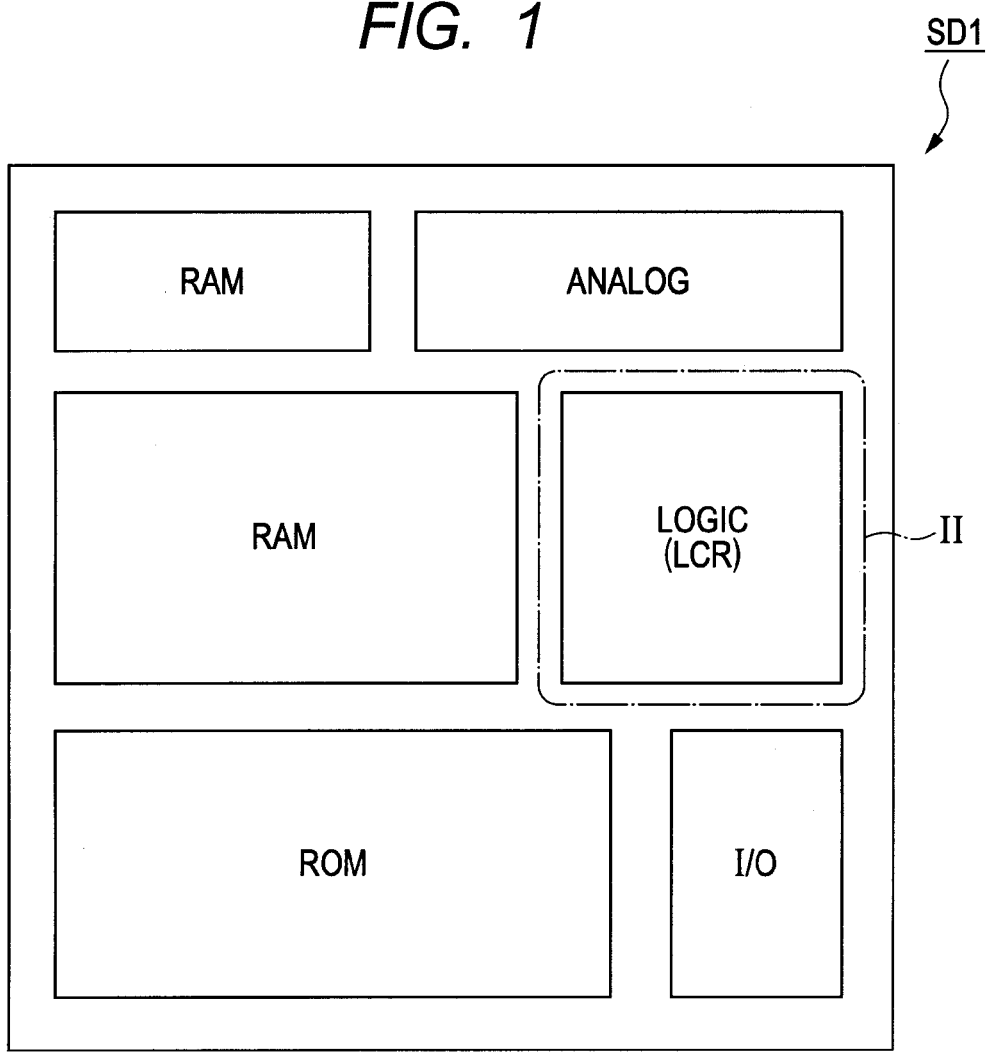
FIG. 1 is a plan view showing an entire configuration of a semiconductor device according to a first embodiment of the present invention.

Standard cells, semiconductor devices having standard cells, and methods for laying out and wiring the standard cells, according to embodiments of the present invention will be described below with reference to the drawings. In the following descriptions of the embodiments, when reference is made for example to the number of elements and quantity, the scope of the present invention is not always limited to the number of elements and quantity referred to unless otherwise specified, further, the same or equivalent parts are denoted by the same reference numerals, and repeated explanations thereof may be omitted.

First Embodiment

Semiconductor Device SD1

A semiconductor device SD1 according to a first embodiment of the present invention will be described with reference to FIGS. 1 to 6. FIG. 1 is a plan view showing an entire configuration of the semiconductor device SD1. Referring to FIG. 1, the semiconductor device SD1 is provided on the surface thereof with Random Access Memory (RAM), Read Only Memory (ROM), ANALOG, LOGIC (hereinafter referred to as a logic circuit region LCR), and input/output region I/O.

Figure 2:
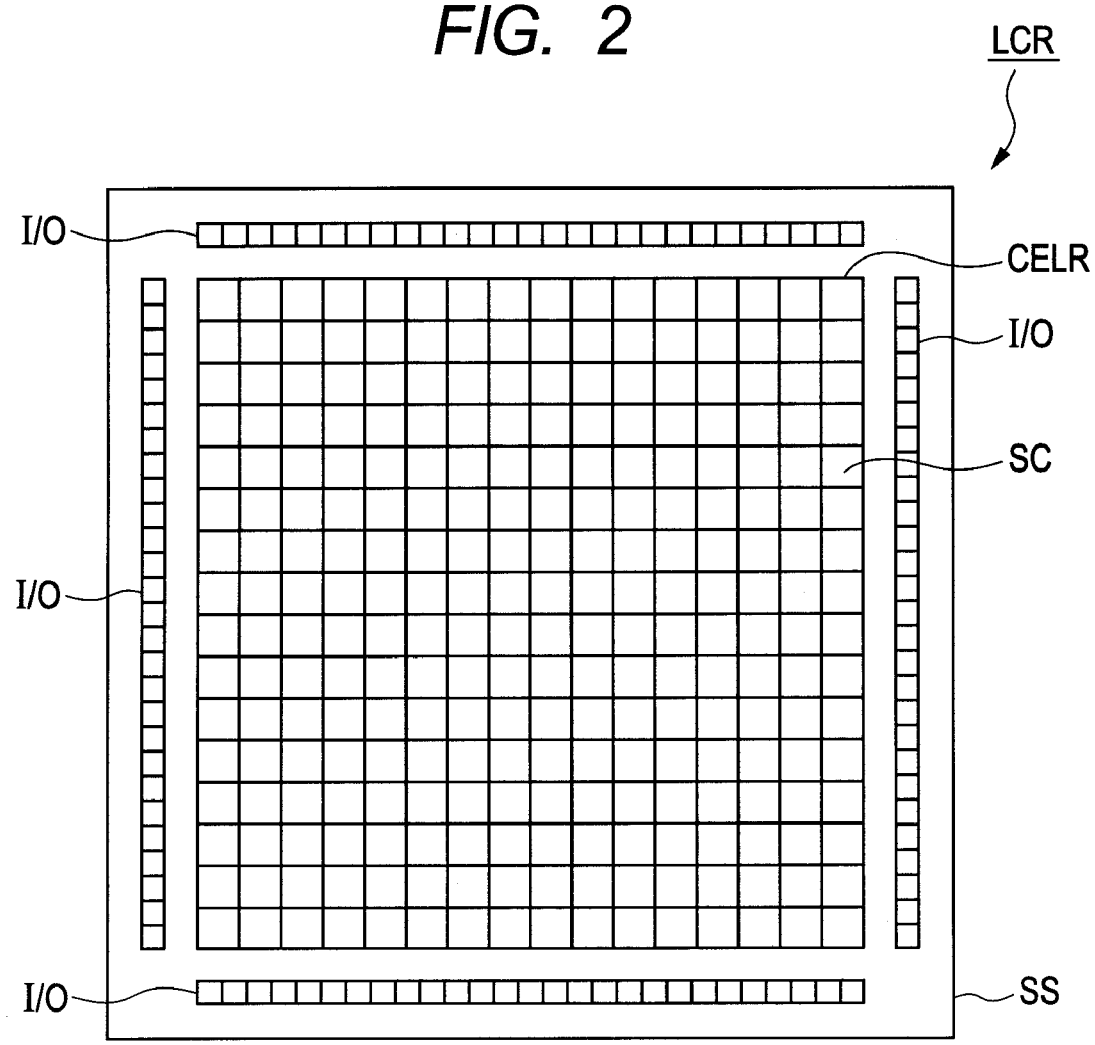
FIG. 2 is an enlarge plan view of an area enclosed with line II in FIG. 1.

FIG. 2 is an enlarged plan view of an area enclosed with line II in FIG. 1, showing a logic circuit region LCR in the semiconductor device SD1. Referring to FIG. 2, the logic circuit region LCR includes a standard cell region CELR, input/output regions I/O positioned around the standard cell region CELR, and pads (not shown) used for input from and output to the exterior.

The standard cell region CELR is defined on the surface of a semiconductor substrate SS. In the standard cell region CELR, standard cells SC are formed on the surface of the semiconductor substrate SS. The standard cells SC are arranged generally in a matrix shape.

(Standard Cell SC)

Figure 3:
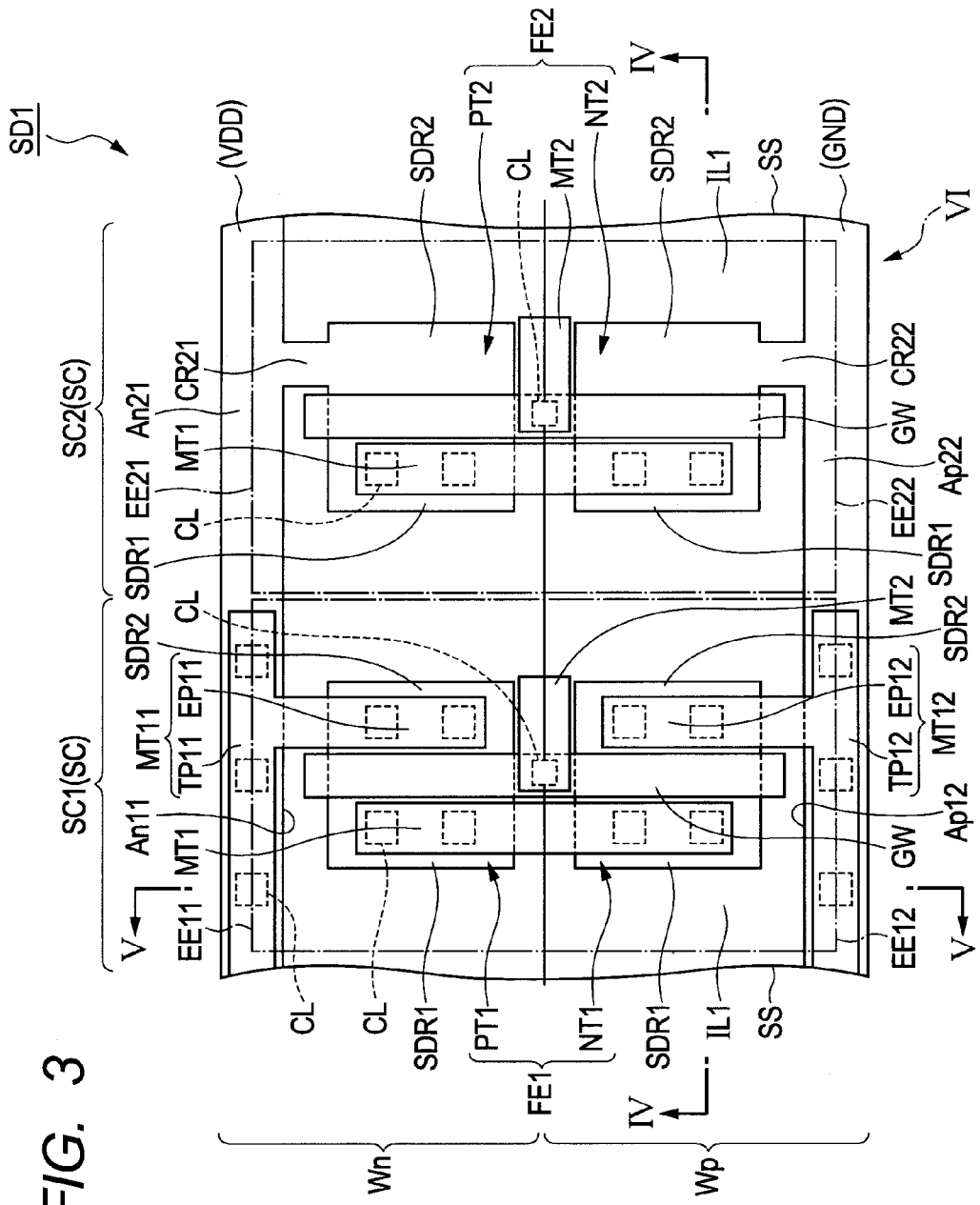
FIG. 3 is a plan view showing a part of plural standard cells in the semiconductor device of the first embodiment.
Figure 4:
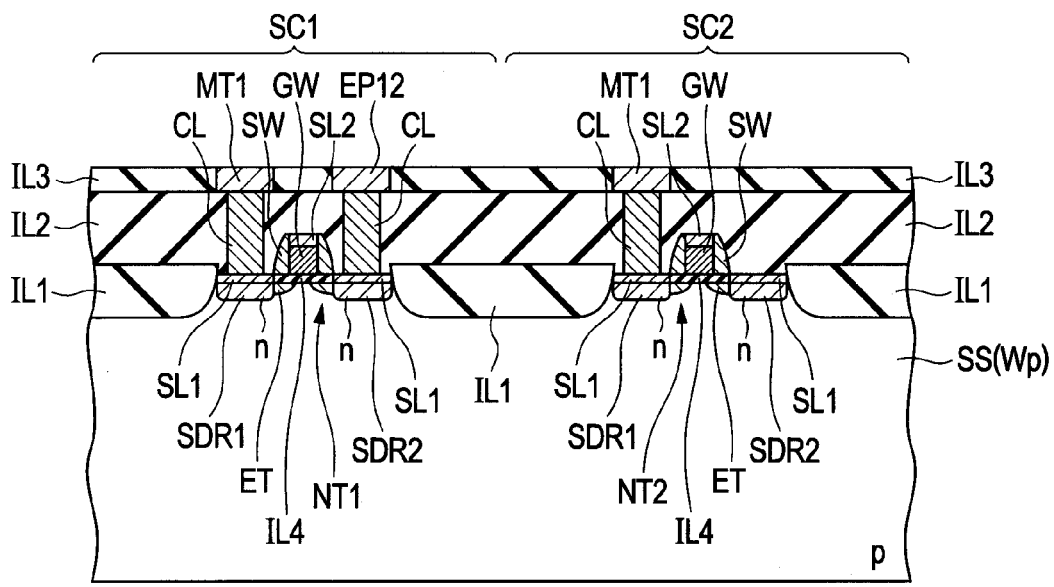
FIG. 4 is a sectional view as seen in the direction of arrow IV-IV in FIG. 3.
Figure 5:
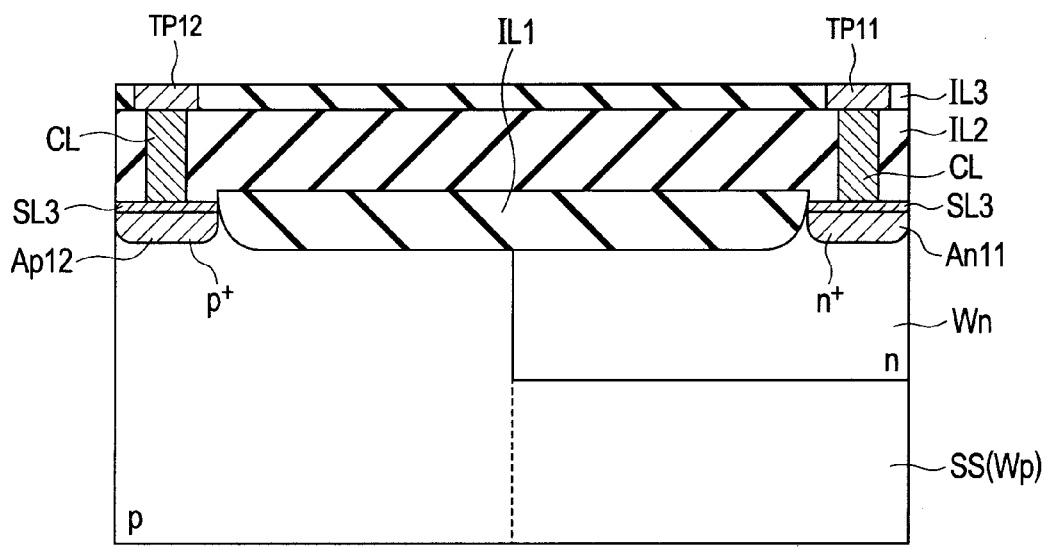
FIG. 5 is a sectional view as seen in the direction of arrow V-V in FIG. 3.
Figure 6:
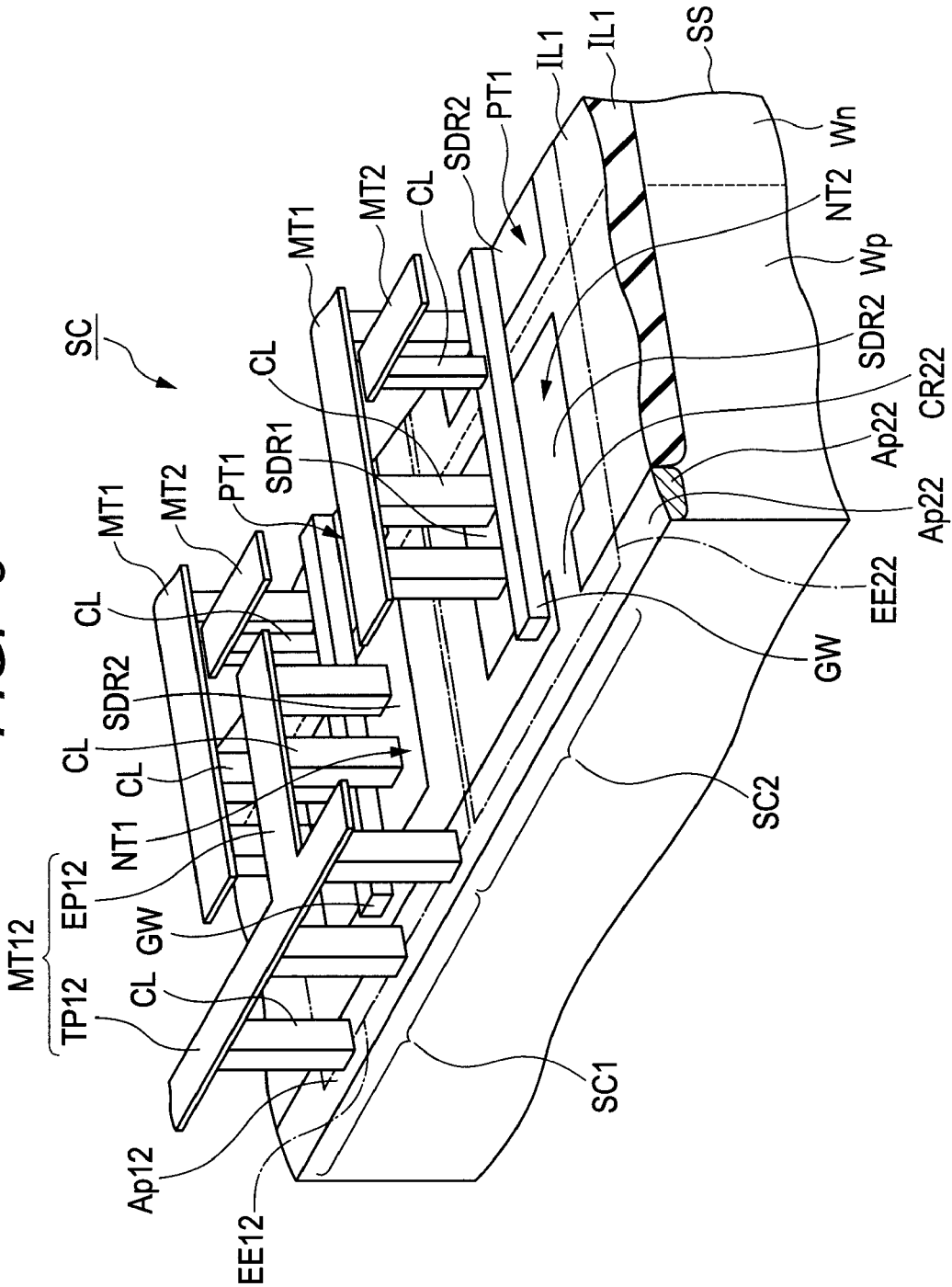
FIG. 6 is a perspective view of standard cells as seen in the direction of arrow VI in FIG. 3.

FIG. 3 is a plan view showing a standard cell SC1 (a first standard cell) and a standard cell SC2 (a second standard cell). FIG. 4 is a sectional view as seen in the direction of arrow IV-IV in FIG. 3. FIG. 5 is a sectional view as seen in the direction of arrow V-V in FIG. 3. FIG. 6 is a perspective view of the standard cells SC1 and SC2 as seen in the direction of arrow VI in FIG. 3.

Referring to FIG. 3, the semiconductor device SD1 includes standard cells SC1 and SC2. The standard cells SC1 and SC2 are a part of plural standard cells SC. Each of the standard cells SC1 and SC2 has a CMOS (Complementary Metal Oxide Semiconductor) structure as an example.

(Standard Cell SC1)

The standard cell SC1 includes semiconductor substrate SS, n-type well region Wn, p-type well region Wp, band-like $n^+$-type diffusion region An11 (first impurity diffusion region), band-like $p^+$-type diffusion region Ap12, insulating layers IL1 to IL3 (see FIG. 4), functional device region FE1 (first functional device region), metal layer MT1, metal layer MT2, metal layer MT11 (first metal layer), metal layer MT12, and plural conductive layers CL.

Referring to FIG. 5, the p-type well region Wp is formed on the semiconductor substrate SS so as to include the surface of the same substrate. The n-type well region Wn is formed selectively on the surface of the p-type well region Wp.

Referring again to FIG. 3, the standard cell SC1 is configured in a rectangular shape when seen in plan and it has outer edges EE11 and EE12 opposed to each other. The outer edges EE11 and EE12 extend in the arranged direction (right-and-left direction in FIG. 3) of the standard cells SC1 and SC2. The standard cell SC1 further has outer edges, the outer edges being continuous with the outer edges EE11 and EE12, extending vertically in FIG. 3 and confronting each other. The outer edges in question extend in the direction perpendicular to the arranged direction (right-and-left direction in FIG. 3) of the standard cells SC1 and SC2.

The $n^+$-type diffusion region An11 is formed on the surface of the n-type well region Wn along the outer edge EE11 (see FIG. 5). The $p^+$-type diffusion region Ap12 is formed on the surface of the p-type well region Wp along the outer edge EE12. A silicide layer SL3 (see FIG. 5) is formed on the surface of each of the diffusion regions An11 and Ap12. The silicide layer SL3 is not shown in FIGS. 3 and 6.

(Functional Device Region FE1)

The functional device region FE1 is formed on the surface of the semiconductor substrate SS and is positioned between the $n^+$-type diffusion region An11 and the $p^+$-type diffusion region Ap12. The functional device region FE1 and the $n^+$-type diffusion layer An11 are opposed to each other spacedly. Also, the functional device region FE1 and the $p^+$-type diffusion layer An12 are opposed to each other spacedly.

The functional device region FE1 includes an n-channel MOS type transistor NT1 and a p-channel MOS type transistor PT1. The transistor NT1 is formed on the surface of the p-type well region Wp, while the transistor PT1 is formed on the surface of the n-type well region Wn.

The insulating layer IL1 is formed on the surface of the semiconductor substrate SS. The insulating layer IL1 is, for example, Shallow Trench Isolation (STI). The transistor NT1 and the $p^+$-type diffusion region Ap12 are isolated from each other by the insulating layer IL1. The transistor PT1 and the $n^+$-type diffusion region An11 are also isolated from each other by the insulating layer IL1.

Referring to FIG. 4, the transistor NT1 is comprised of p-type well region Wp, n-type source-drain regions SDR1, SDR2, n-type extension regions ET, gate electrode layer GW, gate insulating layer IL4, side walls SW, and silicide layers SL1, SL2. The side wall SW and the silicide layers SL1, SL2 are not shown in FIGS. 3 and 6.

The source-drain regions SDR1 and SDR2 are formed on the surface of the p-type well region Wp and are opposed to each other spacedly.

The extension regions ET are formed in the region (hereinafter referred to as the channel region) between the source-drain regions SDR1 and SDR2. One extension region ET overlaps the source-drain region SDR1, while the other extension region ET overlaps the source-drain region SDR2. The extension regions ET extend so as to include the portions under the side walls SW respectively which will be described below.

The gate insulating layer IL4 is formed on the surface of the channel region. The gate electrode layer GW is formed on the surface of the gate insulating layer IL4. The silicide layer SL2 is formed on the surface of the gate electrode layer GW. The side walls SW are formed on both side faces respectively of the gate electrode layer GW.

The transistors NT1 and PT1 are configured about the same except that both are different in conduction type. As to the width, length and depth of the channel region in each of the transistors NT1 and PT1, both transistors NT1 and PT1 may be the same or different, depending on the respective specifications. The gate electrode layer GW, gate insulating layer IL4, side walls SW and silicide layer SL2 are used as components common to both transistors NT1 and PT1.

Referring to FIG. 4, the insulating layer IL1 is formed on the surface of the semiconductor substrate SS. The surfaces of the source-drain regions SDR1, SDR2 (silicide layers SL1) and the surface of the gate electrode layer GW are exposed to the surface of the insulating layer IL1 (toward the insulating layer IL2 to be described below).

The insulating layer IL2 is formed so as to cover the surfaces of the source-drain regions SDR1, SDR2 and the gate electrode layer GW. The insulating layer IL2 and the insulating layer IL3 to be described below are not shown in FIGS. 3 and 6.

In the insulating layer IL2 are formed a plurality of contact holes extending from the surface of the insulating layer IL2 up to the surfaces of the source-drain regions SDR1, SDR2 (silicide layers SL1). Conductive layers CL are formed within the contact holes respectively.

In the insulating layer IL2 is also formed a contact hole extending from the surface of the insulating layer IL2 up to the surface of the gate electrode layer GW (silicide layer SL2) (see FIG. 3). Also within this contact hole is formed a conductive layer CL.

The insulating layer IL3 is formed so as to cover the surfaces of the insulating layer IL2 and the conductive layers CL. A plurality of wiring trenches are formed in the insulating layer IL3. In part of the interior of each wiring trench is exposed the surface of each conductive layer CL. Planar shapes of the wiring trenches correspond to the shapes of the metal layers MT1, MT2, MT11 and MT12 (see FIG. 3) which will be described later.

Referring to FIG. 5, the surface of the $n^+$-type diffusion region An11 (silicide layer SL3) and that of the $p^+$-type diffusion region Ap12 (silicide layer SL3) are also exposed to the surface of the insulating layer IL1 (toward the insulating layer IL2). The insulating layer IL2 is formed so as to cover the surfaces of the diffusion regions An11 and Ap12.

In the insulating layer IL2 are formed a plurality of contact holes extending from the surface of the insulating layer IL2 up to the surfaces of the diffusion regions An11 and Ap12 (silicide layers SL3). Conductive layers CL are formed within those contact holes.

The insulating layer IL3 is formed so as to cover the surfaces of the insulating layer IL2 and those conductive layers CL. A plurality of wiring trenches are formed in the insulating layer IL3. In part of the interior of each wiring trench is exposed the surface of each conductive layer CL. Planar shapes of the wiring trenches correspond to the shapes of the metal layers MT11 and MT12 (see FIG. 3) which will be described below.

(Metal Layers MT1, MT2, MT11, MT12)

Referring to FIGS. 3 and 6, the metal layers MT1, MT2, MT11 and MT12 are formed within the wiring trenches respectively and they are positioned above the surface of the semiconductor substrate SS (on a level with the insulating layer IL3).

The metal layer MT1 is disposed so as to straddle the portions above the source-drain region SDR1 of the transistor PT1 and the source-drain region SDR1 of the transistor NT1. The metal layer MT1 couples the source-drain region SDR1 of the transistor PT1 and the source-drain region SDR1 of the transistor NT1 electrically with each other through conductive layers CL formed on the surfaces of the source-drain regions SDR1.

The metal layer MT2 is disposed so as to include a portion above the gate electrode layer GW. The metal layer MT2 is coupled to the gate electrode layer GW electrically through the conductive layer CL formed on the surface of the gate electrode layer GW. The metal layer MT2 corresponds to a signal line.

The metal layer MT11 has a trunk portion TP11 (a first trunk portion) and an extending portion EP11 (a first extending portion). The trunk portion TP11 extends above and along the n+-type diffusion region An11. The extending portion EP11 extends upwards of the source-drain region SDR2 of the transistor PT1 from the trunk portion TP11.

The metal layer MT11 couples the n+-type diffusion region An11 and the source-drain region SDR2 of the transistor PT1 electrically with each other through conductive layers CL formed on the surfaces of those regions An11 and SDR2. The metal layer MT11 corresponds to a power supply line.

VDD potential can be applied to the source-drain region SDR2 of the transistor PT1 through the metal layer MT11. The potential of the n+-type diffusion region An11 can be fixed through the metal layer MT11.

The metal layer MT12 has a trunk portion TP12 and an extending portion EP12. The trunk portion TP12 extends above and along the p+-type diffusion region Ap12. The extending portion EP12 extends upwards of the source-drain region SDR2 of the transistor NT1 from the trunk portion TP12.

The metal layer MT12 couples the p+-type diffusion region Ap12 and the source-drain region SDR2 of the transistor NT1 electrically with each other through conductive layers CL formed on the surfaces of those regions Ap12 and SDR2. The metal layer MT12 also corresponds to a power supply line.

GND potential can be applied to the source-drain region SDR2 of the transistor NT1 through the metal layer MT12. The potential of the p+-type diffusion region Ap12 can be fixed through the metal layer MT12.

(Standard Cell SC2)

Referring mainly to FIG. 3, the standard cell SC2 includes semiconductor substrate SS, n-type well region Wn, p-type well region Wp, band-like n+-type diffusion region An21 (second impurity diffusion region), band-like p+-diffusion region Ap22, insulating layers IL1 to IL3 (see FIG. 4), functional device region FE2 (second functional device region), n+-type diffusion region CR21 (impurity diffusion region for coupling), p+-type diffusion region CR22, metal layer MT1, metal layer MT2, and a plurality of conductive layers CL.

As is the case with the standard cell SC1, the p-type well region Wp is formed so as to include the surface of the semiconductor substrate SS. The n-type well region Wn is formed selectively on the surface of the p-type well region Wp.

The standard cell SC2 is formed in a rectangular shape in plan. The standard cell SC2 is adjacent to the standard cell SC1 in the extending direction of the trunk portions TP11 and TP12 of the standard cell SC1. The standard cell SC2 has outer edges EE21 and EE22 opposed to each other. The outer edges EE21 and EE22 extend in the arranged direction of the standard cells SC1 and SC2 (in the right-and-left direction in FIG. 3). The standard cell SC2 further has outer edges, the outer edges being continuous with the outer edges EE21 and EE22, extending vertically in the figure and confronting each other. The outer edges in question extend in the direction perpendicular to the arranged direction of the standard cells SC1 and SC2 (in the right-and-left direction in FIG. 3).

The n+-type diffusion region An21 is formed on the surface of the n-type well region Wn along the outer edge EE21. The n+-type diffusion region An21 is continuous with the n+-type diffusion region An11 in the standard cell SC1 and is coupled electrically to the n+-type diffusion region An11.

The p+-type diffusion region Ap22 is formed on the surface of the p-type well region Wp along the outer edge EE22. The p+-type diffusion region Ap22 is continuous with the p+-type diffusion region Ap12 in the standard cell SC1 and is coupled electrically to the p+-type diffusion region Ap12.

As is the case with the diffusion regions An11 and Ap12, silicide layers (not shown) are formed on the surfaces of the diffusion regions An21 and Ap22 respectively.

(Functional Device Region FE2)

The functional device region FE2 is formed on the surface of the semiconductor substrate SS and is positioned between the n+-type diffusion region An21 and the p+-type diffusion region Ap22. The functional device region FE2 and the n+-type diffusion region An21 are opposed to each other spacedly. The functional device region FE2 and the p+-type diffusion region Ap22 also confront each other spacedly.

The functional device region FE2 includes an n-channel MOS type transistor NT2 and a p-channel MOS type transistor PT2. The transistor NT2 is configured about the same as the transistor NT1 in the standard cell SC1. The transistor PT2 is configured almost the same as the transistor PT1 in the standard cell SC1. As to the width, length and depth of the channel region in each of the transistors NT1, NT2, PT1 and PT2, these transistors may be the same or different, depending of the specifications of the transistors.

The n+-type diffusion region CR21 is formed on the surface of the semiconductor substrate SS and is positioned between the n+-type diffusion region An21 and the transistor PT2. The n+-type diffusion region CR21 couples the n+-type diffusion region An21 and the source-drain region SDR2 electrically with each other. It is preferable that a silicide layer (not shown) be formed on the surface of the n+-type diffusion region CR21. The n+-type diffusion region An21 and the transistor PT2 are isolated from each other by the insulating layer IL1 except the area where the n+-type diffusion region CR21 is formed.

The p+-type diffusion region CR22 is formed on the surface of the semiconductor substrate SS and is positioned between the p+-type diffusion region Ap22 and the transistor NT2. The p+-type diffusion region CR22 couples the p+-type diffusion region Ap22 and the source-drain region SDR2 of the transistor NT2 with each other electrically. It is preferable that a silicide layer (not shown) be formed on the surface of the p+-type diffusion region CR22. The p+-type diffusion region Ap22 and the transistor NT2 are isolated from each other by the insulating layer IL1 except the area where the p+-type diffusion region CR22 is formed.

Referring to FIG. 4, the insulating layer IL1 is formed on the surface of the semiconductor substrate SS. The surfaces of the source-drain regions SDR1, SDR2 (silicide layers SL1) and the gate electrode layer GW are exposed to the surface of the insulating layer IL1 (toward the insulating layer IL2 to be described below).

The insulating layer IL2 is formed so as to cover the surfaces of the insulating layer IL1, the source-drain regions SDR1, SDR2 and the gate electrode layer GW. The insulating layer IL2 and the insulating layer IL3 to be described below are not shown in FIGS. 3 and 6.

In the insulating layer IL2 are formed a plurality of contact holes extending from the surface of the insulating layer IL2 up to the surface of each source-drain region SDR1 (silicide layer SL1). Conductive layers CL are formed within the contact holes respectively.

In the insulating layer IL2 is also formed a contact hole extending from the surface of the insulating layer IL2 up to the surface of the gate electrode layer GW (silicide layer SL2) (see FIG. 3). Also in the interior of this contact hole is formed a conductive layer CL.

The insulating layer IL3 is formed so as to cover the surfaces of the insulating layer IL2 and the conductive layers CL. A plurality of wiring trenches are formed in the insulating layer IL3. In part of the interior of each wiring trench is exposed the surface of each conductive layer CL. Planar shapes of the wiring trenches correspond to the shapes of the metal layers MT1 and MT2 (see FIG. 3) which will be described later.

The surface of the n$^+$-type diffusion region An21 (silicide layer) and that of the p$^+$-type diffusion region Ap22 (silicide layer) are also exposed to the surface of the insulating layer IL1 (toward the insulating layer IL2). The insulating layer IL2 is formed so as to cover the surfaces of the diffusion regions An21 and Ap22. The insulating layer IL3 is formed so as to cover the surface of the insulating layer IL2.

(Metal Layers MT1, MT2)

Referring to FIG. 3, the metal layers MT1 and MT2 are formed within the wiring trenches respectively. The metal layers MT1 and MT2 are positioned above the surface of the semiconductor substrate SS (on a level with the insulating layer IL3).

The metal layer MT1 is disposed so as to straddle the portions above the source-drain region SDR1 of the transistor PT2 and the source-drain region SDR1 of the transistor NT2. The metal layer MT1 couples the source-drain region SDR1 of the transistor PT2 and the source-drain region SDR1 of the transistor NT2 with each other electrically through conductive layers CL formed on the surfaces of the source-drain regions SDR1.

The metal layer MT2 is disposed so as to include a portion above the gate electrode layer GW. The metal layer MT2 is coupled electrically to the gate electrode layer GW through a conductive layer CL formed on the surface of the gate electrode layer GW. The metal layer MT2 corresponds to a signal line.

The metal layer MT11 in the standard cell SC1 is coupled electrically to the source-drain region SDR2 of the transistor PT2 in the standard cell SC2. The current path concerned is comprised of the trunk portion TP11 of the metal layer MT11, the conductive layers CL formed between the trunk portion TP11 of the metal layer MT11 and the n+-type diffusion region An11, the n$^+$-type diffusion region An11, the n$^+$-type diffusion region An21, and the n$^+$-type diffusion region CR21, in this order.

By this electrical coupling, VDD potential can be applied through the metal layer MT11 to the source-drain region SDR2 of the transistor PT2 in the standard cell SC2. The potential of the n$^+$-type diffusion region An21 in the standard cell SC2 can be fixed through the metal layer MT11. It becomes possible to reduce the electric resistance value in this current path because a silicide layer is formed on the surface of each of the n$^+$-type diffusion layers An21 and CR21.

Likewise, the metal layer MT12 in the standard cell SC1 is coupled electrically to the source-drain region SDR2 of the transistor NT2 in the standard cell SC2. The current path concerned is comprised of the trunk portion TP12 of the metal layer MT12, the conductive layers CL formed between the trunk portion TP12 of the metal layer MT12 and the p$^+$-type diffusion layer Ap12, the p$^+$-type diffusion layer Ap12, the p$^+$-type diffusion layer Ap22, and the p$^+$-type diffusion layer CR22, in this order.

By this electrical coupling, GND potential can be applied through the metal layer MT12 to the source-drain region SDR2 of the transistor NT2 in the standard cell SC2. The potential of the p$^+$-type diffusion region Ap22 in the standard cell SC2 can be fixed through the metal layer MT12. It becomes possible to reduce the electric resistance in this current path because a silicide layer is formed on the surface of each of the p$^+$-type diffusion regions Ap22 and CR22.

(Effect)

Above the n$^+$-type diffusion region An21 (on a level with the insulating layer IL3) the standard cell SC2 does not have a metal layer (a power supply line) for applying VDD potential to the functional device region FE2. In other words, above the n$^+$-type diffusion region An21 there is present "a space area" where a metal layer for applying VDD potential to the functional device region FE2 in the standard cell SC2 is not formed.

Also above the p$^+$-type diffusion region Ap22 (on a level with the insulating layer IL3) is present a space area where a metal layer (a power supply line) for applying GND potential to the functional device region FE2 is not formed.

According to the semiconductor device SD1 of this embodiment, by utilizing the aforesaid space areas it is possible to dispose a metal layer (not shown) which provides coupling between other plural standard cells so as to include the space areas. With the semiconductor device SD1 it is possible to increase the resource for disposing the metal layer which couples between other plural standard cells. By disposing the metal layer in question on a level with the insulating layer IL3, the metal layer in question and the metal layers MT1, MT2, MT11, MT12 can be formed in one and same process.

It is here assumed that the standard cell SC2 does not have any space area. Above each of the diffusion regions An21 and Ap22 is disposed a metal layer for applying VDD potential or GND potential to the functional device region FE2 in the standard cell SC2. In this case, it is necessary that another metal layer for coupling between other plural standard cells be disposed so as to bypass the said metal layer. With another bypassing metal layer, the chip area increases. Particularly, with the recent integration of standard cells, the bypassing route of another metal layer expands complicatedly not only in the horizontal direction but also in the vertical direction, resulting in that not only the chip area increases but also the design freedom is deteriorated.

According to the semiconductor device SD1 of this embodiment, since the metal layer for coupling between other plural standard cells is disposed so as to include the foregoing space area, it is possible to shorten the bypassing distance of the metal layer in question (the overall length of the metal layer). According to the semiconductor device SD1, by utilizing the space area it is possible to suppress an increase of the chip area and hence possible to provide a semiconductor device of a smaller chip area. Moreover, according to the semiconductor device SD1, it is possible to enhance the design freedom for layout of standard cells and hence possible to achieve a high integration of standard cells.

Further, according to the semiconductor device SD1, the length of the metal layer for coupling between other plural standard cells can be shortened by utilizing the space area. Since the current path of the metal layer for coupling between other plural standard cells becomes shorter, it is possible to reduce the electric resistance value in the metal layer in question. According to the semiconductor device SD1, by utilizing the space area, the transistor elements formed in other plural standard cells can be operated at a higher speed.

In the semiconductor device SD1, the current path for applying VDD voltage to the transistor PT1 is comprised of the metal layer MT11 (trunk portion TP11, extending portion EP11) and conductive layers CL. On the other hand, the current path for applying VDD potential to the transistor PT2 is comprised of the metal layer MT11, conductive layers CL, n$^+$-type diffusion region An11, n$^+$-type diffusion region An21, and n$^+$-type diffusion region CR21.

The electric resistance between the metal layer MT11 and the transistor PT2 is larger than the electric resistance between the metal layer MT11 and the transistor PT1. Between the metal layer MT11 and the transistor PT2 is developed a voltage drop larger than that between the metal layer MT1 and the transistor PT1. Likewise, the electric resistance between the metal layer MT12 and the transistor NT2 exhibits a larger voltage drop in comparison with the electric resistance between the metal layer MT12 and the transistor NT1.

Preferably, the configuration and layout of the standard cells SC1 and SC2 are determined on the basis of the specification of voltage or circuit configuration used so that the voltage drop in the standard cell SC2 lies within an allowable range.

Another Configuration in First Embodiment

Semiconductor Device SD1A

Referring to FIG. 3, in the semiconductor device SD1 of the above first embodiment, the foregoing space area is present above each of the n$^+$-type diffusion region An21 and the p+-type diffusion region Ap22. The space area may be present above either the n$^+$-type diffusion region An21 or the p$^+$-type diffusion region Ap22.

Figure 7:
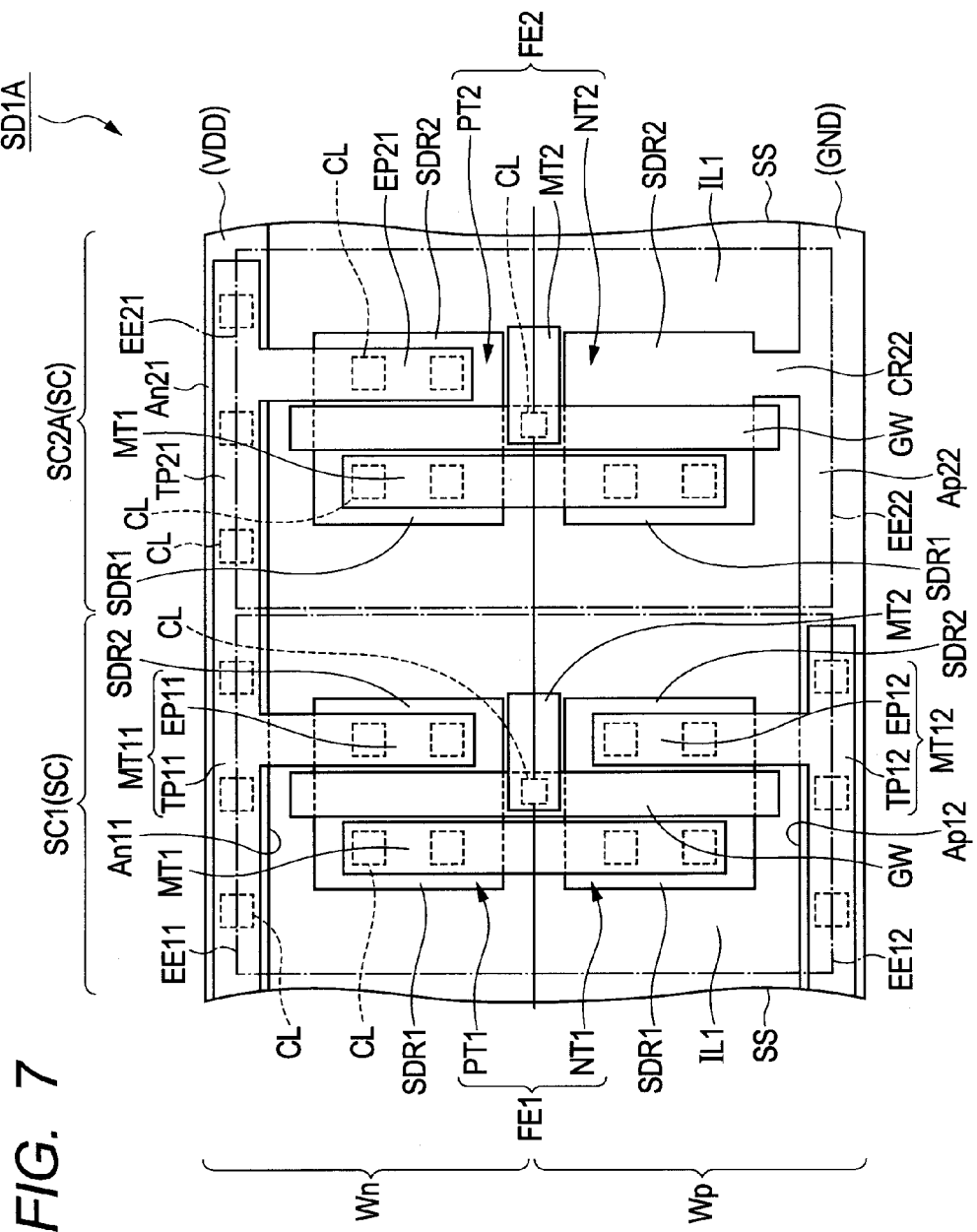
FIG. 7 is a plan view showing a part of plural standard cells in another configuration of the first embodiment.

More specifically, with reference to FIG. 7, the space area may be present above only the p$^+$-type diffusion region Ap22 as is the case with a standard cell SC2A in the semiconductor device SD1A. In the standard cell SC2A, a trunk portion TP21 is formed so as to extend the trunk portion TP11 of the metal layer MT11 upwards of the n$^+$-type diffusion region An21.

A plurality of conductive layers CL are formed between the trunk portion TP21 and the n$^+$-type diffusion region An21. Like the extending portion EP11 in the standard cell SC1, an extending portion EP21 is formed so as to extend upwards of the source-drain region SDR2 of the transistor PT2 from the trunk portion TP21.

A plurality of conductive layers CL are formed between the extending portion EP21 and the source-drain region SDR2 of the transistor PT2. In the standard cell SC2A, the transistor PT2 and the n$^+$-type diffusion region An21 are isolated from each other by the insulating layer IL1.

VDD voltage is applied to the source-drain region SDR2 of the transistor PT2 through the trunk portion TP21 and the extending portion EP21. The potential of the n$^+$-type diffusion region An21 is fixed through the trunk portion TP21 and the extending portion EP21.

Even when a space area is present above only the p$^+$-type diffusion region Ap22, by utilizing the space area, a metal layer (not shown) for coupling between other plural standard cells can be disposed so as to include the space area. By utilizing the space area it is possible to suppress an increase of the chip area and provide a semiconductor device of a smaller chip area. By disposing the metal layer for coupling between other plural standard cells on a level with the insulating layer IL3, the said metal layer and the metal layers MT1, MT2, MT11, MT12 can be formed in one and same process.

Second Embodiment

Semiconductor Device SD2

A semiconductor device SD2 according to a second embodiment of the present invention will be described with reference to FIG. 8. The semiconductor device SD2 includes a metal layer MT20A and standard cells SC10A, SC10B, SC20A, SC20B, SC30A and SC30B, which cells are formed on the surface of a semiconductor substrate SS.

The standard cells SC10A, SC10B, SC30A and SC30B are configured about the same as the standard cell SC1 (see the left side in FIG. 3) used in the semiconductor device SD1 of the previous first embodiment. Functional device regions FE1 in the standard cells SC10A and SC10B and functional device regions FE3 in the standard cells SC30A and SC30B are also configured almost the same as the functional device region FE1 in the standard cell SC1 (see the left side in FIG. 3) used in the semiconductor device SD1 of the first embodiment.

Figure 8:
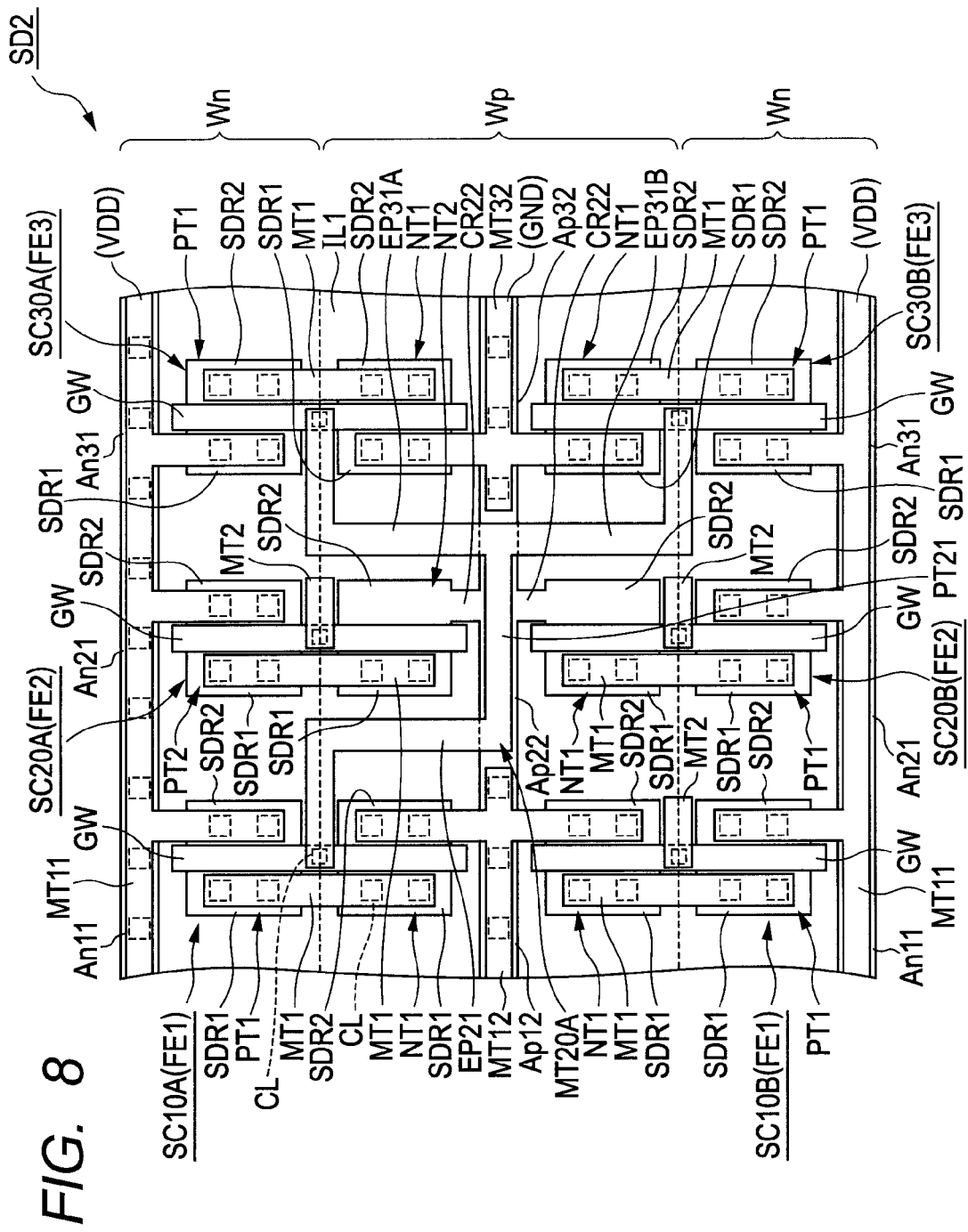
FIG. 8 is a plan view showing a part of plural standard cells in a second embodiment of the present invention.

In FIG. 8, for the convenience of illustration, the outer edges EE11 and EE12 (see FIG. 3) in the standard cell SC1 and outer edges of SC10A, SC10B, SC30A and SC30B corresponding to outer edges (extending vertically in the figure) continuous with the outer edges EE11 and EE12 are not shown. The outer edges not shown are defined like the outer edges EE11 and EE12 in the standard cell SC1 and outer edges (extending vertically in FIG. 3) continuous with the outer edges EE11, EE12. This is also true in the standard cells SC20A and SC20B to be described later and further true in FIG. 9 and FIGS. 12 to 14 which will be referred to later.

The functional device regions FE1 in the standard cells SC10A and SC10B and the functional device regions FE3 in the standard cells SC30A and SC30B are formed on the surface of the semiconductor substrate SS.

The standard cells SC20A and SC20B are configured about the same as the standard cell SC2A (see the right side in FIG. 7) used in the semiconductor device of the above another configuration of the first embodiment. Functional device regions FE2 in the standard cells SC20A and SC20B are also configured about the same as the functional device region FE2 used in the standard cell SC2A (see the right side in FIG. 7) of the semiconductor device SD1A according to the above another configuration of the first embodiment. The functional device regions FE2 in the standard cells SC20A and SC20B are formed on the surface of the semiconductor substrate SS.

The standard cells SC10A and SC20A are adjacent to each other and so are the standard cells SC20A and SC30A. Likewise, the standard cells SC10B and SC20B are adjacent to each other and so are the standard cells SC20B and SC30B.

The standard cells SC10A and SC10B are configured approximately in axial symmetry with respect to a p$^+$-type diffusion region Ap12 (a first impurity diffusion region). The p$^+$-type diffusion region Ap12 is common as a component to both standard cells SC10A and SC10B.

The p$^+$-type diffusion layer Ap12 and each of the functional device regions FE1 in the standard cells SC10A and SC10B are opposed to each other spacedly. A metal layer MT12 corresponding to a power supply line (VDD potential) is common as a component to both standard cells SC10A and SC10B.

The standard cells SC20A and SC20B are configured in axial symmetry with respect to a p$^+$-type diffusion region Ap22 (a second impurity diffusion region). The p$^+$-type diffusion region Ap22 is common as a component to both standard cells SC20A and SC20B.

The p$^+$-type diffusion region Ap22 and each of the functional device regions FE2 in the standard cells SC20A and SC20B are opposed to each other spacedly. GND potential is applied to each of a source-drain region SDR2 of a transistor NT2 in the standard cell SC20A and a source-drain region SDR2 of a transistor NT2 in the standard cell SC20B through metal layer MT12, metal layer MT32, p$^+$-type diffusion region Ap12, p$^+$-type diffusion region Ap22, p$^+$-type diffusion region Ap32 and p$^+$-type diffusion region CR22.

The standard cells SC30A and SC30B are configured in axial symmetry with respect to the p+-type diffusion region Ap32 (a third impurity diffusion region). The p+-type diffusion region Ap32 is common as a component to both standard cells SC30A and SC30B.

The p+-type diffusion region Ap32 and each of the functional device regions FE3 (third functional device regions) in the standard cells SC30A and SC30B are opposed to each other spacedly. The metal layer MT32, which corresponds to a power supply line (VDD potential), is common as a component to both standard cells SC30A and SC30B.

An n+-type diffusion region An11 in the standard cell SC10A, an n+-type diffusion region An21 in the standard cell SC20A, and an n+-type diffusion region An31 in the standard cell SC30A, are continuous. The n+-type diffusion region An31 is positioned on the side opposite to the n+-type diffusion region An11 with respect to the n+-type diffusion region An21. These regions are mutually coupled electrically.

The p+-type diffusion region Ap12 in the standard cell SC10A, the p+-type diffusion region Ap22 in the standard cell SC20A, and the p+-type diffusion region Ap32 in the standard cell SC30A, are continuous. The p+-type diffusion region Ap22 is positioned on the side opposite to the p+-type diffusion region Ap12 with respect to the p+-type diffusion region Ap22. These regions are mutually coupled electrically.

Above the p+-type diffusion region Ap22 (on a level with an insulating layer IL3), the standard cells SC20A and SC20B do not have a metal layer (a power supply line) for applying GND potential to each of the respective functional device regions FE2. In other words, above the p+-type diffusion region Ap22 there exists "a space region" where a metal layer for applying GND potential to each of the functional device regions FE2 in the standard cells SC20A and SC20B is not formed. By utilizing this space area, a metal layer MT20A to be described below is disposed so as to include the space area.

(Metal Layer MT20A)

The metal layer MT20A is positioned above the surface of the semiconductor substrate SS (for example on a level with the insulating layer IL3). The metal layer MT20A includes a trunk portion TP21 (a second trunk portion), an extending portion EP21 (a second extending portion), an extending portion EP31A (a third extending portion), and an extending portion EP31B.

The trunk portion TP21 extends above and along the p+-type diffusion region Ap22. The extending portion EP21 is formed in L shape in plan and extends from the trunk portion TP21 up to above the functional device region FE1 in the standard cell SC10A. The extending portion EP21 is coupled electrically to a gate electrode layer GW in the functional device region FE1 of the standard cell SC10A.

The extending portion EP31A is formed in L shape in plan and extends from the trunk portion TP21 up to above the functional device region FE3 in the standard cell SC30A. The extending portion EP31A is coupled electrically to a gate electrode layer GW in the functional device region FE3 of the standard cell SC30A through a conductive layer CL.

The extending portion EP31B is formed in L shape in plan and extends from the trunk portion TP21 up to above the functional device region FE3 in the standard cell SC30B. The extending portion EP31B is coupled electrically to a gate electrode layer GW in the functional device region FE3 of the standard cell SC30B through a conductive layer CL.

The metal layer MT20A couples the functional device region FE1 in the standard cell SC10A with the functional device region FE3 in the standard cell SC30A electrically. Further, the metal layer MT20A couples the functional device region FE1 in the standard cell SC10A with the functional device region FE3 in the standard cell SC30B electrically.

(Effect)

Above the p+-type diffusion region Ap22 there exists a space area where a metal layer for applying GND potential to each of the functional device regions FE2 in the standard cells SC20A and SC20B is not formed. By utilizing this space area, the metal layer MT20A is disposed on a level with metal layers MT1, MT2, MT11, MT12, MT32 so as to include the said space area. The metal layer MT20A can be formed in the same process as the metal layers MT1, MT2, MT11, MT12 and MT32.

It is here assumed that the standard cells SC20A and SC20B do not have the space area in question. Above the p+-type diffusion region Ap22 is disposed a single metal layer for applying GND potential to each of the functional device regions FE2 in the standard cells SC20A and SC20B.

In this case, for example in order to couple the functional device region FE1 in the standard cell SC10A and the functional device region FE3 in the standard cell SC30A with each other electrically it is necessary to dispose another metal layer so as to bypass the said single metal layer. This is also true of the functional device region FE1 in the standard cell SC10A and the functional device region FE3 in the standard cell SC30B.

According to the semiconductor device SD2, by utilizing the space area, it is possible to suppress an increase of the chip area and provide a semiconductor device of a smaller chip area. Also, according to the semiconductor device SD2 it is possible to enhance the design freedom for the layout of standard cells and achieve a high integration of standard cells.

Further, according to the semiconductor device SD2, the length of the metal layer MT20A can be shortened by utilizing the space area. Since the current path in the metal layer MT20A becomes shorter, it is possible to reduce the resistance value in the metal layer MT20A. According to the semiconductor device SD2, by utilizing the space area, the transistor elements formed in the functional device region FE1 in the standard cell SC10a and the functional device regions FE3 in the standard cells SC30A, SC30B can be operated at a higher speed.

Another Configuration in Second Embodiment

Although in the semiconductor device SD2 of the above second embodiment the metal layer MT20A is coupled to both functional device regions FE3 in the standard cells SC30A and SC30B, but the metal layer MT20A may be coupled to one of the functional device regions FE3.

In the semiconductor device SD2 of the above second embodiment the metal layers MT1, MT2, MT11, MT12, MT32 and MT20A are formed within wiring trenches respectively formed in the insulating layer IL3 and are positioned substantially flush with one another.

The planar height at which the metal layer MT20A extends may be lower than the planar height at which the metal layers MT11, MT12 and MT32 are formed if only it is above the surface of the semiconductor substrate SS. More preferably, the planar height at which the trunk portion TP21 of the metal layer MT20A extends is lower than the planar height at which the metal layers MT11, MT12 and MT32 are formed. The lower the planar height at which the metal layer MT20A extends, the larger the foregoing space area can be ensured and it becomes possible to increase the resource for disposing the metal layer which couples between other plural standard cells.

The metal layer MT20A may be disposed so that the lower surface of the metal layer MT20A contacts the surface of the electrode layer GW. In this case, it becomes possible to couple the metal layer MT20A and the gate electrode layer GW electrically with each other without interposition of a conductive layer CL.

Third Embodiment

Semiconductor Device SD3

Figure 9:
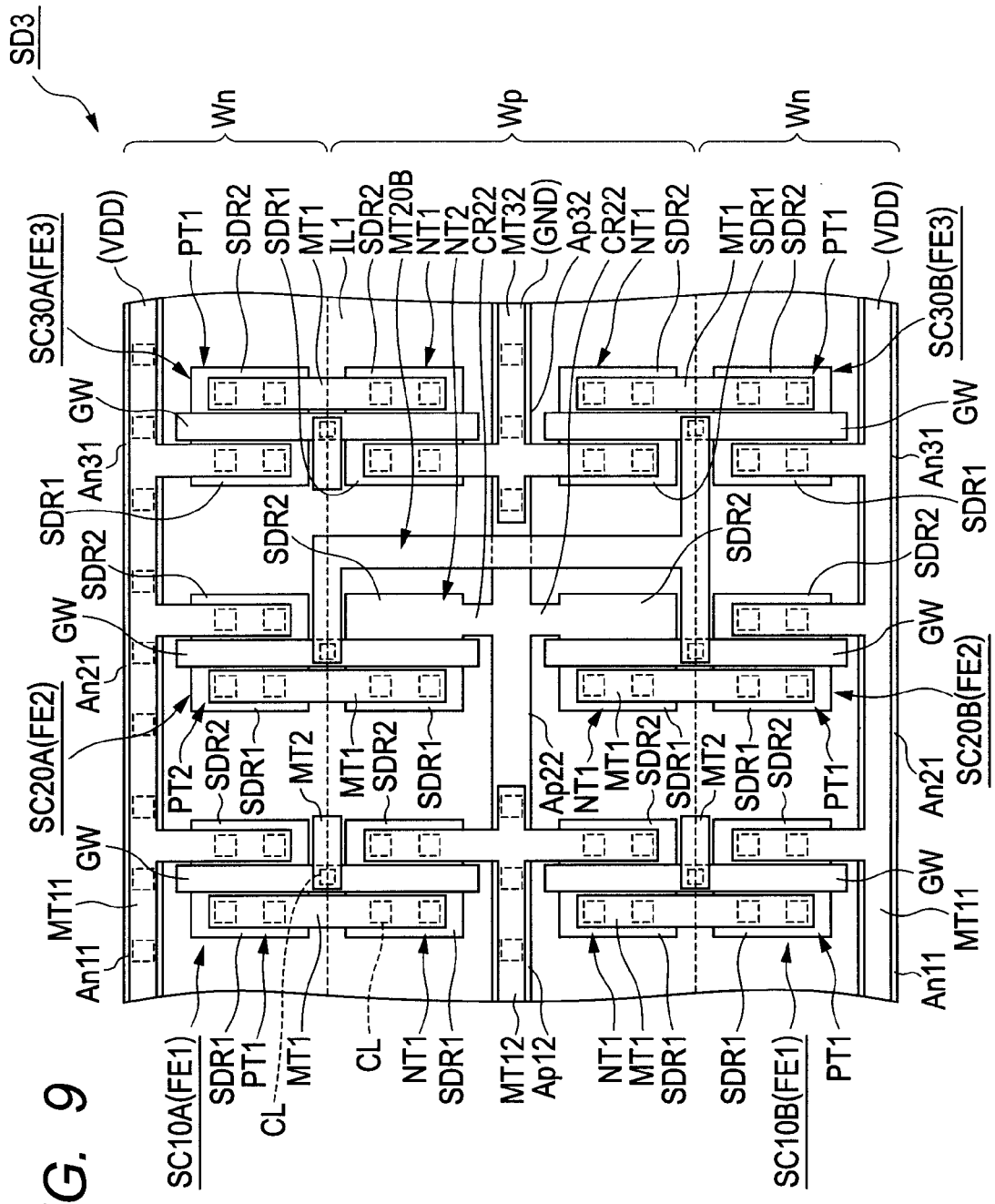
FIG. 9 is a plan view showing a part of plural standard cells in a third embodiment of the present invention.

A semiconductor device SD3 according to a third embodiment of the present invention will be described with reference to FIG. 9. The semiconductor device SD3 includes a metal layer MT20B and standard cells SC10A, SC10B, SC20A, SC20B, SC30A and SC30B formed on the surface of a semiconductor substrate SS.

The standard cells SC10A, SC10B, SC20A, SC20B, SC30A and SC30B are configured about the same as the standard cells SC10A, SC10B, SC20A, SC20B, SC30A and SC30B (see FIG. 8) respectively used in the semiconductor device SD2 of the previous second embodiment.
(Metal Layer MT20B)

The metal layer MT20B is positioned above the surface of the semiconductor substrate SS (for example on a level with an insulating layer IL3). The metal layer MT20B includes a portion extending in parallel with a direction joining a functional device region FE2 in the standard cell SC20A and a functional device region FE2 in the standard cell SC20B. This portion straddles a p$^+$-type diffusion region Ap22 at a position above the same region.

One end (the upper side in FIG. 9) of the metal layer MT20B is formed in L shape in plan, extending up to above the functional device region FE2 in the standard cell SC20A, and it is coupled to a gate electrode layer GW in the functional device region FE2 of the standard cell SC20A electrically through a conductive layer CL.

An opposite end portion (the lower side in FIG. 9) of the metal layer MT20B is formed in T shape in plan, extending above the functional device region FE2 in the standard cell bSC20B up to above a functional device region FE3 in the standard cell SC30B, and it is electrically coupled through a conductive layer CL to a gate electrode layer GW in the functional device region FE2 of the standard cell SC20B and also coupled through a conductive layer CL to a gate electrode layer GW in the functional device region FE3 of the standard cell SC30B.
(Effect)

Above the p$^+$-type diffusion region Ap22 there exists a space area where a metal layer for applying GND potential to each of the functional device regions FE2 in the standard cells SC20A and SC20B is not formed. By utilizing this space area, the metal layer MT20B is disposed on a level with metal layers MT1, MT2, MT11, MT12 and MT32 so as to include the space area. The metal layer MT20B can be formed in the same process as the metal layers MT1, MT2, MT11, MT12 and MT32. According to the semiconductor device SD3 it is possible to obtain the same effects as in the semiconductor device SD2 of the previous second embodiment.

Another Configuration in Third Embodiment

Although in the semiconductor device SD3 of the above third embodiment the metal layer MT20B is coupled to both functional device regions FE2 and FE3 in the standard cells SC30A and SC30B, it may be coupled to one of those regions.

Preferably, the extending height of the metal layer MT30B is lower than the planar height at which the metal layers MT11, MT12 and MT32 are formed, if only it is above the surface of the semiconductor substrate SS. More preferably, a planar height of the portion where the metal layer MT20B straddles the p$^+$-type diffusion region Ap22 is lower than the planar height at which the metal layers MT11 and MT32 are formed. The metal layer MT20B may be disposed so that its lower surface contacts the surfaces of the gate electrode layers GW.

Fourth Embodiment

With reference to FIGS. 10 to 14, a description will be given about a standard cell laying out and wiring method ST (see FIG. 11) according to a fourth embodiment of the present invention. The layout and wiring method ST is for the standard cells used in the semiconductor devices of the above first to third embodiments (each including another configuration described above).

Figure 10:
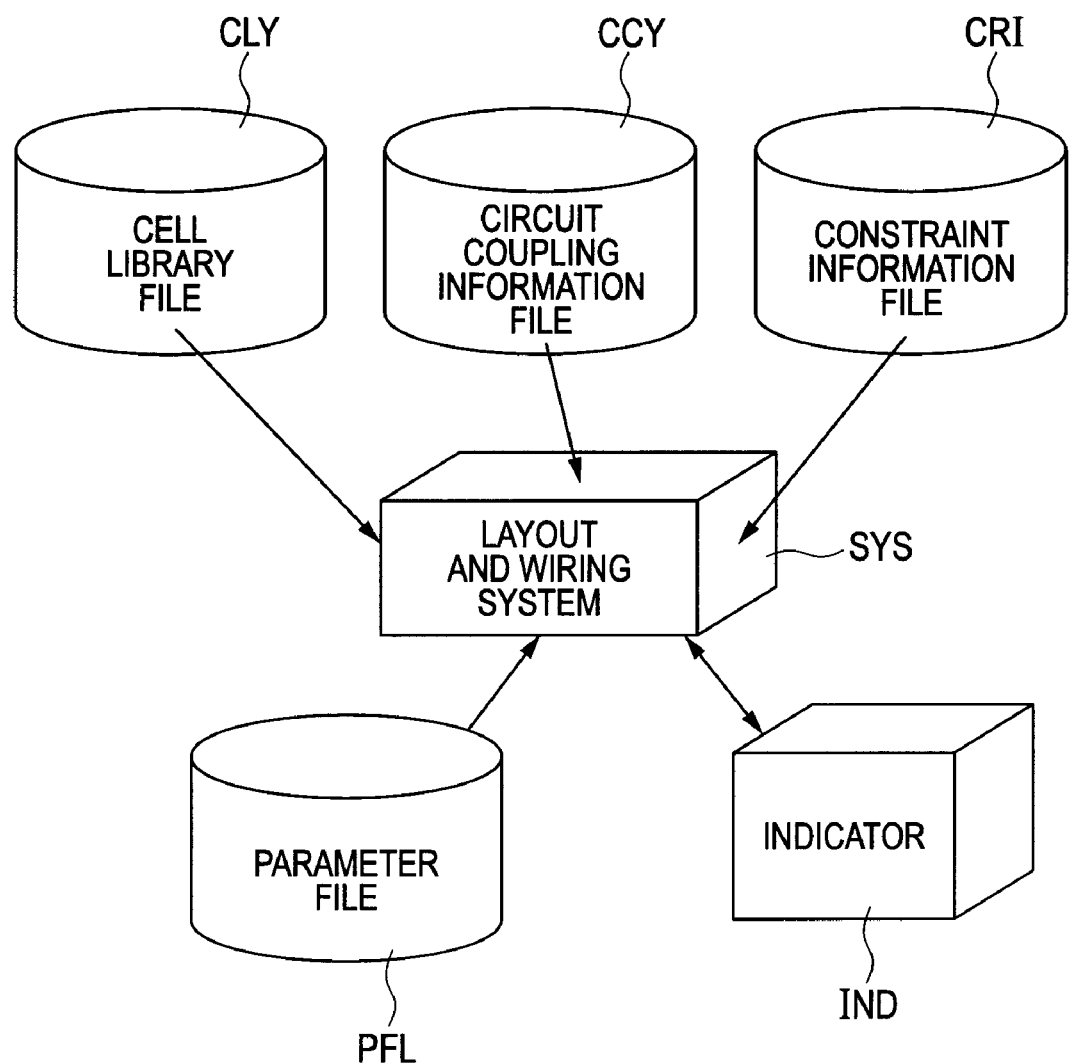
FIG. 10 is a diagram showing schematically the configuration of a layout and wiring method according to a fourth embodiment of the present invention.

FIG. 10 is a diagram showing the configuration of the layout and wiring method ST schematically. First, there are provided a layout and wiring system SYS, a cell library file CLY, a circuit coupling information file CCY, a constraint information file CRI, a parameter file PFL, and an indicator IND.

Receiving a predetermined command is the layout and wiring system SYS, which designs layout of plural standard cells and power supply lines. Upon receipt of another predetermined command the layout and wiring system SYS designs wiring lines for coupling the standard cells and the wiring lines.

The cell library file CLY stores pattern information on the standard cells used in the previous embodiments. The cell library file CLY stores pattern information on the standard cell SC2 (see the right side in FIG. 3) used in the first embodiment and pattern information on the standard cell SC2A (see the right side in FIG. 7) referred to in the foregoing another configuration of the first embodiment.

The circuit coupling information file CCY stores circuit information which configures the semiconductor device to be designed and coupling information (circuit diagram) between circuits. The constraint information file CRI stores various constraint information on layout and wiring (e.g., chip size and tolerance of wiring density to be described later). The parameter file PFL stores information on operating frequency and operating temperature of each transistor element included in the semiconductor device to be designed, p- and n-type diffusion regions, and each metal layer resistance. The indicator IDN indicates the progress and result of layout and wiring.

Figure 11:
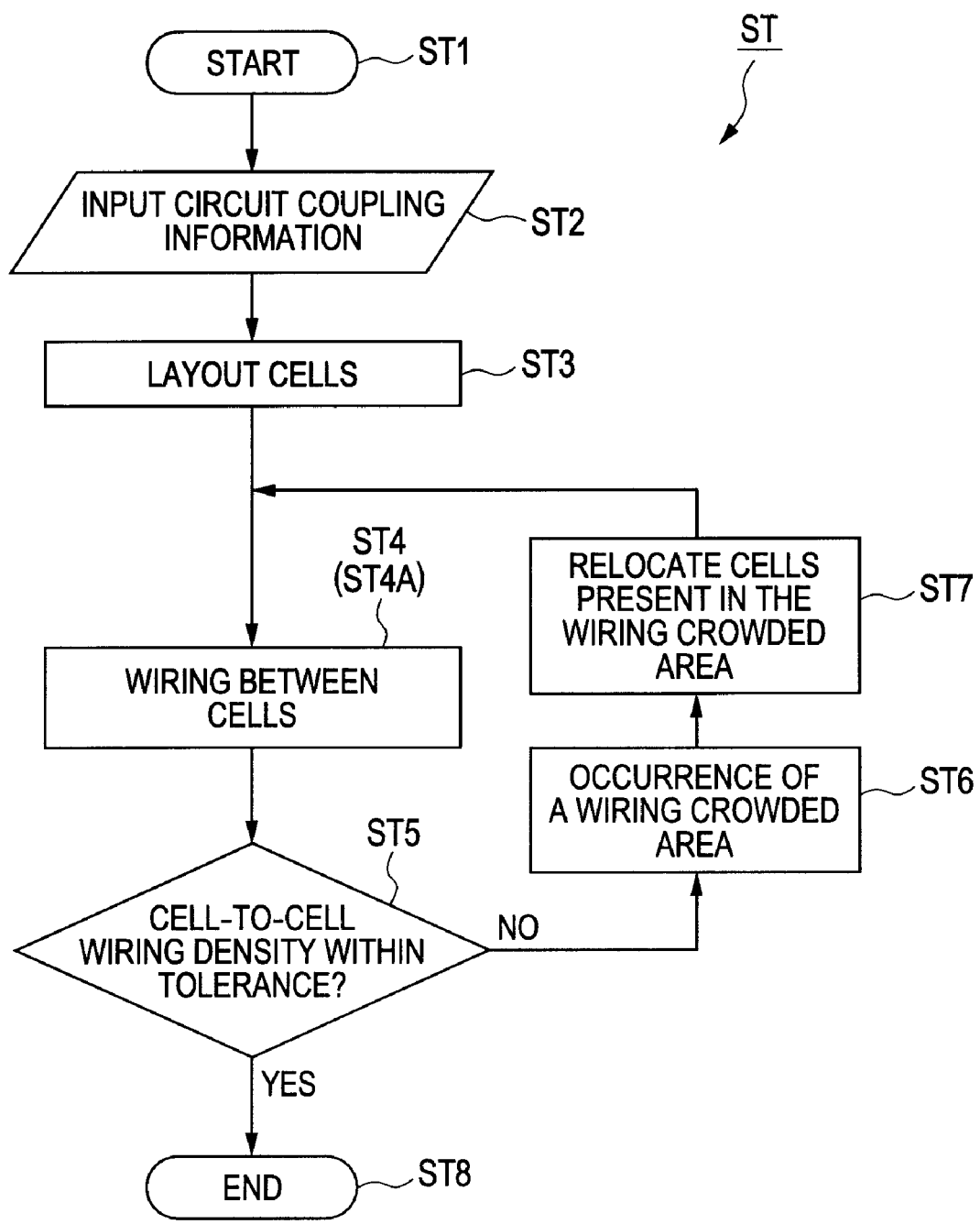
FIG. 11 is a diagram showing constituent steps of the layout and wiring method in the fourth embodiment.

With reference to FIG. 11, a description will be given below about steps ST1 to ST8 in the layout and wiring method ST.

In step ST1 there are provided layout and wiring system SYS, cell library file CLY, circuit coupling information file CCY, constraint information file CRI, parameter file PFL, and indicator IND.

In step ST2, predetermined circuit coupling information which has been designed in accordance with a desired function of the semiconductor device to be designed is inputted from the circuit coupling information file CCY to the layout and wiring system SYS.

In step ST3, the layout and wiring system SYS reads pattern information on the standard cell corresponding to the above circuit coupling information from the cell library CLY. Pattern information on the standard cell SC2 (see the right side in FIG. 3) in the first embodiment and pattern information on the standard cell SC2A (see the right side in FIG. 7) in the foregoing another embodiment of the first embodiment are not included in the standard cell pattern information which is read out by the layout and wiring system SYS in step ST3.

The layout and wiring system SYS lay outs the read-out standard cell pattern information cell by cell so as to correspond to the above circuit coupling information. In this case, it is preferable that the chip size be set (fixed) to a predetermined size in advance.

Figure 12:
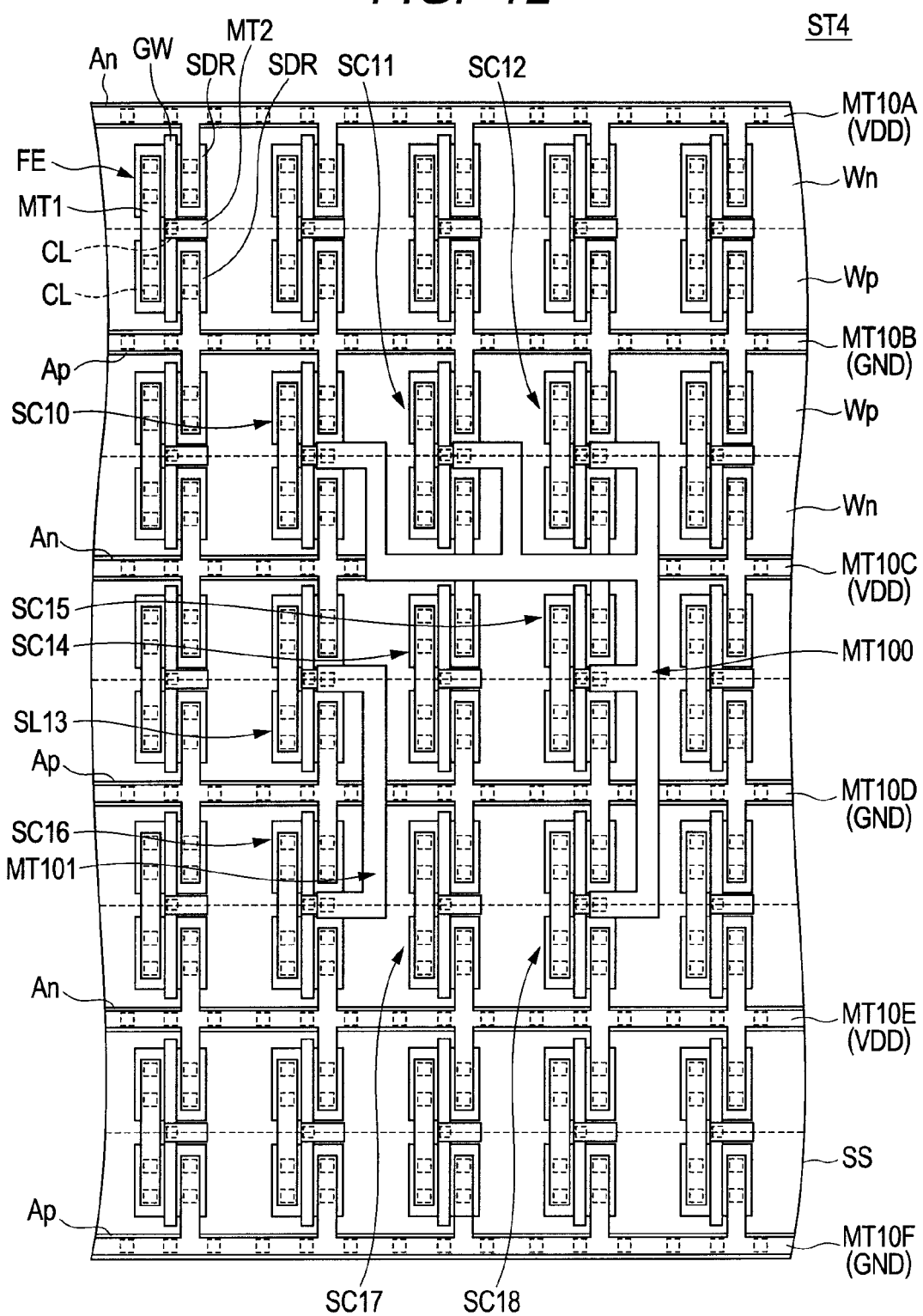
FIG. 12 is a plan view showing an example of a completed state of step ST4 in the fourth embodiment.

In step ST4, the layout and wiring system SYS lays out signal lines and power supply lines between standard cells so as to correspond to the above circuit coupling information. FIG. 12 shows an example of a completed state of step ST4 in the layout and wiring method ST.

Referring to FIG. 12, standard cells including standard cells SC10 to SC18 are formed on the surface of a semiconductor substrate SS. These standard cells SC10 to SC18 are formed almost the same as the standard cell SC1 (see FIG. 3) used in the first embodiment. $N^+$-type diffusion regions An and $p^+$-type diffusion regions Ap are formed alternately at equal intervals on the surface of the semiconductor substrate SS and are in a mutually parallel positional relation.

Metal layers MT10A, MT10C and MT10E extend above and along the $n^+$-type diffusion regions An. Likewise, metal layers MT10B, MT10D and MT10F extend above and along the $p^+$-type diffusion regions Ap.

A metal layer MT100 couples metal layers MT2 (signal lines) in the standard cells SC10, SC11, SC12, SC15 and SC18 electrically with one another. The metal layer MT100 is disposed above the metal layers MT10C and MT10D so as to straddle the both metal layers. Further, the metal layer MT100 is disposed so as to partially include portions above the metal layers MT2. The metal layers MT100 and MT2 are coupled together electrically through conductive layers CL each formed between the metal layer MT100 and each metal layer MT2.

A metal layer MT101 couples metal layers MT2 (signal lines) in the standard cells SC13 and SC16 electrically with each other. The metal layer MT101 is disposed above the metal layer MT10D so as to straddle the metal layer MT10D. The metal layer MT101 is disposed so as to partially include portions above the metal layers MT2. The metal layer MT101 and the metal layers MT2 are coupled together electrically through conductive layers CL each formed between the metal layer MT101 and each metal layer MT2.

In step ST5 (see FIG. 11), the layout and wiring system SYS measures the densities of wiring lines for coupling among plural standard cells (including the standard cells SC10 to SC18). The layout and wiring system SYS compares the measured wiring densities with a predetermined value (tolerance) which has been preset in the constraint information file CRI (see FIG. 10).

If there exists an area with the wiring density exceeding the predetermined value, the layout and wiring system SYS detects the said area as a wiring crowded area and causes the indicator IND to indicate the result of the detection. If all the densities of wiring lines coupling among the standard cells are not larger than the predetermined value, the layout and wiring method ST ends (step ST8).

In this embodiment, in step ST6, the layout and wiring system SYS detects the area where the metal layers MT100 and MT101 are disposed as a wiring crowded area.

In step ST7, the layout and wiring system SYS relocates the standard cells SC11, SC12, SC14, SC15, SC17 and SC18 which are present in the wiring crowded area. More specifically, the layout and wiring system SYS reads out pattern information on the standard cell SC2 (see the right side in FIG. 3) used in the first embodiment and pattern information on the standard cell SC2A (see the right side in FIG. 7) used in the foregoing another configuration of the first embodiment and replaces the standard cells SC11, SC12, SC14, SC15, SC17 and SC18.

Figure 13:
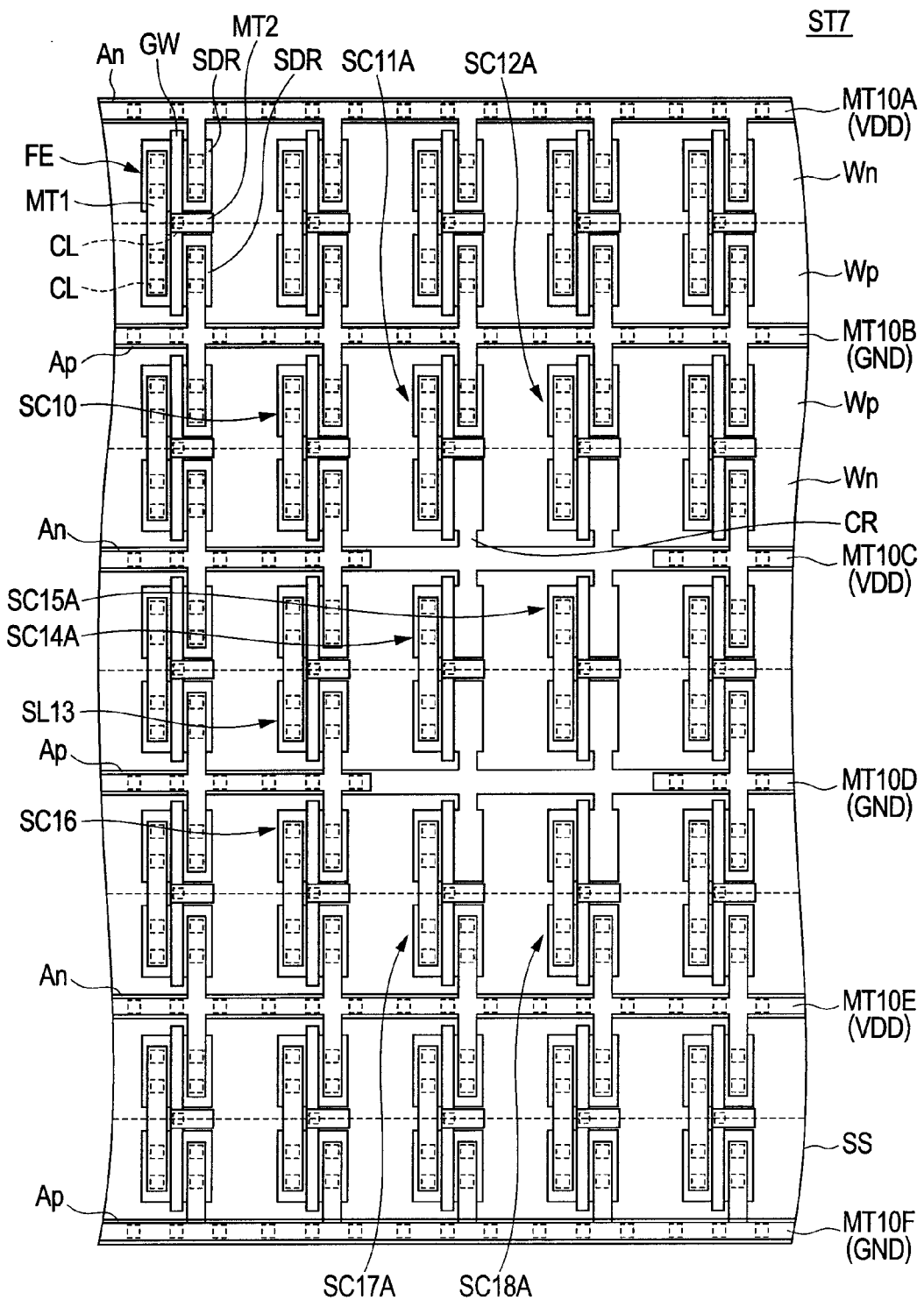
FIG. 13 is a plan view showing an example of a completed state of step ST7 in the fourth embodiment.

The standard cells SC11, SC12, SC14, SC15, SC17 and SC18 are replaced by standard cells SC11A, SC12A, SC14A, SC15A, SC17A and SC18A respectively (see FIG. 13).

The standard cells SC11A, SC12A, SC17A and SC18A are configured about the same as the standard cell SC2A described in the foregoing another configuration of the first embodiment. The standard cells SC14A and SC15A are configured about the same as the standard cell SC2 described in the first embodiment.

Source-drain regions SDR in functional device regions FE of the standard cells SC11A, SC12A, SC14A, SC15A, SC17A and SC18A and the diffusion regions An, Ap are coupled together electrically through diffusion regions CR.

A space area is present above the $n^+$-type diffusion region An positioned between the standard cells SC11A and SC14A and a space area is also present above the $n^+$-type diffusion region An positioned between the standard cells SC12A and SC15A.

Likewise, a space area is present above the $p^+$-type diffusion region Ap positioned between the standard cells SC14A and SC17A and a space area is present also above the $p^+$-type diffusion region Ap positioned between the standard cells SC15A and SC18A.

Figure 14:
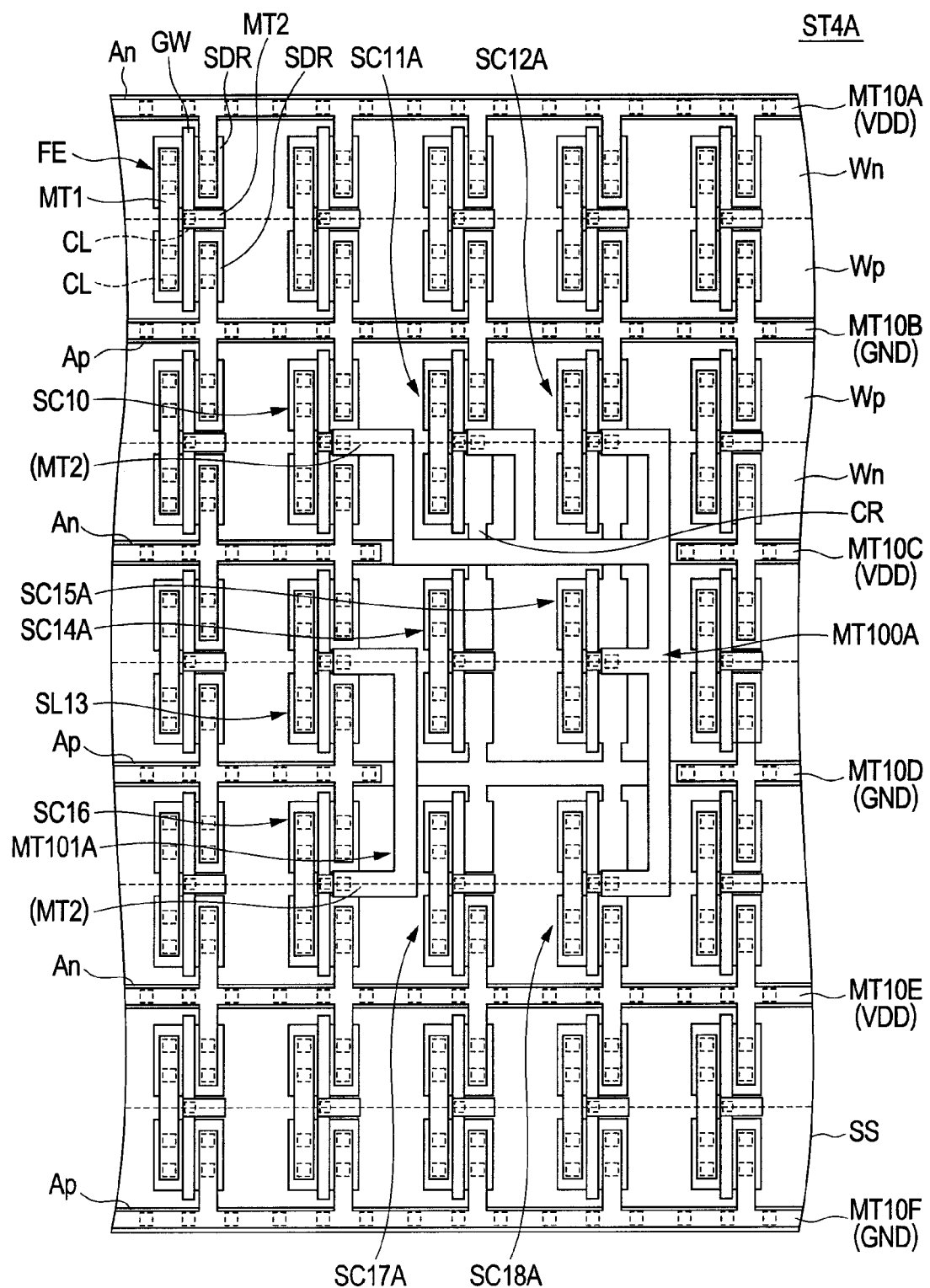
FIG. 14 is a plan view showing an example of a completed state of step ST4A in the fourth embodiment.

In step ST4A (see FIG. 11), by utilizing the above space areas, the layout and wiring system SYS relocates signal lines and power supply lines between the standard cells so as to correspond to the above circuit coupling information. FIG. 14 shows an example of a completed state of step ST4A in the layout and wiring method ST.

Referring to FIG. 14, the metal layers MT2 (signal lines) in the standard cells SC10, SC11A, SC12A, SC15A and SC18A are coupled together electrically through a metal layer MT100A. The metal layers MT2 and the metal layer MT100A are coupled together electrically by being coupled together directly, while each metal layer MT2 and each gate electrode layer GW are coupled together electrically through a conductive layer CL. By utilizing the foregoing space areas the metal layer MT100A is disposed above $n^+$-type diffusion region An and $p^+$-type diffusion region Ap so as to straddle both diffusion regions An, Ap. Preferably, the metal layer MT100A is formed in the same process as the metal layers MT1, MT2 and MT10A to MT10F.

Likewise, the metal layers MT2 (signal lines) in the standard cells SC13 and SC16 are coupled together electrically by a metal layer MT101A. The metal layers MT2 and the metal layer MT101A are coupled together electrically by being coupled together directly and each metal layer MT2 and each gate electrode layer GW are coupled together electrically through a conductive layer CL. By utilizing the foregoing space area the metal layer MT101A is disposed above a $p^+$-type diffusion region Ap so as to straddle the same region.

In step ST5 (see FIG. 11), the layout and wiring system SYS again measures the densities of wiring lines for coupling between plural standard cells. Preferably, the layout and wiring system SYS repeats the above steps ST6 and ST7 so that all the measured wiring densities are not larger than the predetermined value (tolerance). When all the wiring densities between plural standard cells have become not larger than the predetermined value, the layout and wiring method ends (step ST8).

(Effect)

According to the layout and wiring method ST of this embodiment, standard cells located near the wiring crowded area are replaced by the foregoing standard cell SC2 or SC2A. The metal layer for coupling between other plural standard cells is disposed so as to include the foregoing space areas, whereby the bypassing distance (overall length) of the metal layer in question can be shortened. In the semiconductor device obtained by using the layout and wiring method ST, an increase of the chip area is suppressed by utilizing the space areas.

By disposing the metal layer MT100A and the metal layers MT1, MT2 and MT10A to MT10F at the same height (for example on a level with the insulating film IL3), it becomes possible to form the metal layer MT100A in the same process as the metal layers MT1, MT2 and MT10A to MT10F. That is, for example, wiring trenches are patterned beforehand in the insulating layer IL3 to form the metal layer MT100A and the metal layers MT1, MT2, MT10A to MT10F, and are then subjected to a single or continuous processing, thereby making it possible to form the metal layer MT100A and the metal layers MT1, MT2, MT10A to MT10F. As a result, in the case where the metal layer MT100A and the metal layers MT1, MT2, MT10A to MT10F, are disposed at the same height, the manufacturing time can be shortened by forming those metal layers by a single or continuous processing.

By using the layout and wiring method ST it becomes possible to obtain a semiconductor device of a smaller chip area and it is also possible to enhance the design freedom for laying out standard cells, further, it becomes possible to achieve a high integration of standard cells.

Another Configuration in Fourth Embodiment

In step ST3 in the above fourth embodiment, the standard cell SC2 in the first embodiment and the standard cell SC2A in the foregoing another configuration of the first embodiment are not included in the standard cell pattern information read out by the layout and wiring system SYS. However, the standard cells SC2 and SC2A may be included in the standard cell pattern information read out by the layout and wiring system SYS in step ST3.

In this case, the layout and wiring system SYS includes the standard cells SC2 and SC2A in items to be selected and then disposes the read-out pattern information on plural standard cells cell by cell so as to correspond to the foregoing circuit coupling information. Preferably, the standard cells SC2 and SC2A are applied to, for example, cells with inputs of 4 or more. According to this configuration, the semiconductor device is designed in a state in which the occurrence of the foregoing wiring crowded area is suppressed.

Referring to FIG. 11, in connection with the layout and wiring method ST of the above fourth embodiment, a description has been made about a mode in which after completion of step ST4A, steps ST5 to ST7 are again repeated so that all the wiring densities become not larger than the predetermined value (tolerance). However, the layout and wiring method ST may end upon completion of step ST4A, (step ST8). Preferably, whether the wiring densities are to be measured again or not is determined after receipt of a predetermined command which is inputted through the indicator IND (see FIG. 10) for example.

Although standard cells, semiconductor devices having standard cells, and standard cell laying out and wiring methods, have been described above by way of embodiments of the present invention, it should be understood that the above embodiments are illustrative and not limitative in all points.

For example, although in each of the above embodiments a description has been made on the basis of a semiconductor device which configures a CMOS structure having a NOT gate function, embodiments of the present invention are not limited thereto. The present invention is applicable also to semiconductor devices which configure various logic circuits such as, for example, a plurality of transistor elements having a NOR gate function or a plurality of transistor elements having a NAND gate function.

Thus, the scope of the present invention is shown by the scope of claims and it is contemplated that all changes in meanings and scopes equivalent to the scope of claims are included in the scope of the present invention.

The present invention is applicable particularly advantageously to a semiconductor device having a plurality of standard cells and a method for laying out and wiring a plurality of standard cells.

What is claimed is:

1. A semiconductor device comprising first and second standard cells formed over a surface of a semiconductor substrate, wherein the first standard cell includes:

a first functional device region formed over the surface of the semiconductor substrate;

band-like first impurity diffusion regions formed over the surface of the semiconductor substrate and disposed oppositely to each other with both sides of the first functional device region therebetween; and metal layers disposed above the surface of the semiconductor substrate, the metal layers each including a trunk portion and an extending portion, the trunk portions of the metal layers extending above and along the first impurity diffusion regions respectively, the extending portions of the metal layers extending upwards of the first functional device region, wherein the second standard cell includes:

a second functional device region formed over the surface of the semiconductor substrate;

band-like second impurity diffusion regions formed over the surface of the semiconductor substrate and disposed oppositely to each other with both sides of the second functional device region therebetween, the second impurity diffusion regions being continuous with the first impurity diffusion regions respectively; and impurity diffusion regions for coupling formed over the surface of the semiconductor substrate to couple electrically between the second impurity diffusion regions and the second functional device region, and wherein the metal layers and the second functional device region are coupled electrically with each other through the trunk portions, the first impurity diffusion regions, the second impurity diffusion regions and the impurity diffusion regions for coupling.

2. The semiconductor device according to claim 1, wherein the first standard cell includes:

an first n-channel MOS type transistor (NT1) and a first p-channel MOS type transistor (PT1) disposed in the first functional device region;

wherein the second standard cell includes:

an second n-channel MOS type transistor (NT2) and a second p-channel MOS type transistor (PT2) disposed in the second functional device region.

3. A method for laying out and wiring the standard cell described in claim 2, comprising the steps of:
providing a cell library with pattern information on the second standard cell and the first standard cell stored therein;
inputting predetermined circuit coupling information to a layout and wiring system,
allowing the layout and wiring system to read out the pattern information on predetermined standard cells which include the first standard cell and other than the second standard cell from the cell library and to lay out the pattern information on the standard cells so as to correspond to the circuit coupling information;
detecting the occurrence of a wiring crowded area in which the density of wiring lines coupling between the standard cells exceeds a predetermined value; and
allowing the layout and wiring system to read out the pattern information on the second standard cell from the cell library and to replace the first standard cell included in the wiring crowded area by the second standard cell.

* * * * *